(12) United States Patent
Goodman et al.

(10) Patent No.: US 8,613,474 B2
(45) Date of Patent: Dec. 24, 2013

(54) SUBSTRATE LOADER AND UNLOADER HAVING A BERNOULLI SUPPORT

(75) Inventors: Daniel Goodman, Lexington, MA (US); Arthur Keigler, Wellesley, MA (US); Freeman Fisher, Charlestown, MA (US); David G. Guarnaccia, Carlisle, MA (US)

(73) Assignee: Tel Nexx, Inc., Billerica, MA (US)

( * ) Notice: Subject to any disclaimer, the term of this patent is extended or adjusted under 35 U.S.C. 154(b) by 59 days.

(21) Appl. No.: 13/279,405

(22) Filed: Oct. 24, 2011

(65) Prior Publication Data

US 2013/0011225 A1 Jan. 10, 2013

Related U.S. Application Data

(60) Provisional application No. 61/504,942, filed on Jul. 6, 2011, provisional application No. 61/504,920, filed on Jul. 6, 2011, provisional application No. 61/527,222, filed on Aug. 25, 2011.

(51) Int. Cl.
*A47J 45/00* (2006.01)

(52) U.S. Cl.
USPC .......................................... 294/64.3; 294/189

(58) Field of Classification Search
USPC .................. 294/183, 64.3, 188, 189, 65, 213; 269/20, 21; 414/937, 941; 901/40, 46, 901/47
See application file for complete search history.

(56) References Cited

U.S. PATENT DOCUMENTS

| | | | |
|---|---|---|---|
| 751,699 A | 2/1904 | Teeter et al. | |
| 4,566,726 A | 1/1986 | Correnti et al. | |
| 4,778,332 A | 10/1988 | Byers et al. | |
| 5,067,762 A | 11/1991 | Akashi | |
| 5,547,415 A * | 8/1996 | Hasegawa et al. | 451/44 |
| 6,379,103 B1 | 4/2002 | Okugi | |
| 6,517,130 B1 | 2/2003 | Donoso et al. | |
| 6,631,935 B1 | 10/2003 | Casarotti et al. | |
| 6,648,974 B1 * | 11/2003 | Ogliari et al. | 118/719 |
| 6,688,662 B2 | 2/2004 | Casarotti et al. | |
| 6,824,613 B2 * | 11/2004 | Dai et al. | 118/72 |
| 6,896,304 B2 * | 5/2005 | Li et al. | 294/185 |
| 6,948,898 B2 | 9/2005 | Berger et al. | |
| 7,022,211 B2 | 4/2006 | Yoshioka et al. | |
| 7,100,954 B2 | 9/2006 | Klein et al. | |
| 7,104,579 B2 | 9/2006 | Casarotti et al. | |
| 7,144,056 B2 | 12/2006 | Casarotti et al. | |
| 7,445,697 B2 | 11/2008 | Keigler et al. | |
| 7,543,867 B2 | 6/2009 | Pun et al. | |
| 7,607,647 B2 | 10/2009 | Zhao et al. | |
| 7,690,869 B2 * | 4/2010 | Yo et al. | 406/88 |
| 7,823,941 B2 | 11/2010 | Caldwell et al. | |

* cited by examiner

*Primary Examiner* — Stephen Vu
(74) *Attorney, Agent, or Firm* — Rothwell, Figg, Ernst & Manbeck, P.C.

(57) ABSTRACT

A substrate chuck includes a frame forming a support adapted to support an adhering surface thereon, and a Bernoulli chuck surface coupled to the frame and adapted to support the substrate. The Bernoulli chuck surface is axially moveable relative to the support between first and second positions. In the first position, the substrate is coupled to the adhering surface, and the substrate is separated from the adhering surface with movement of the Bernoulli chuck from the first position to the second position, without contact between the substrate and the Bernoulli chuck surface.

30 Claims, 16 Drawing Sheets

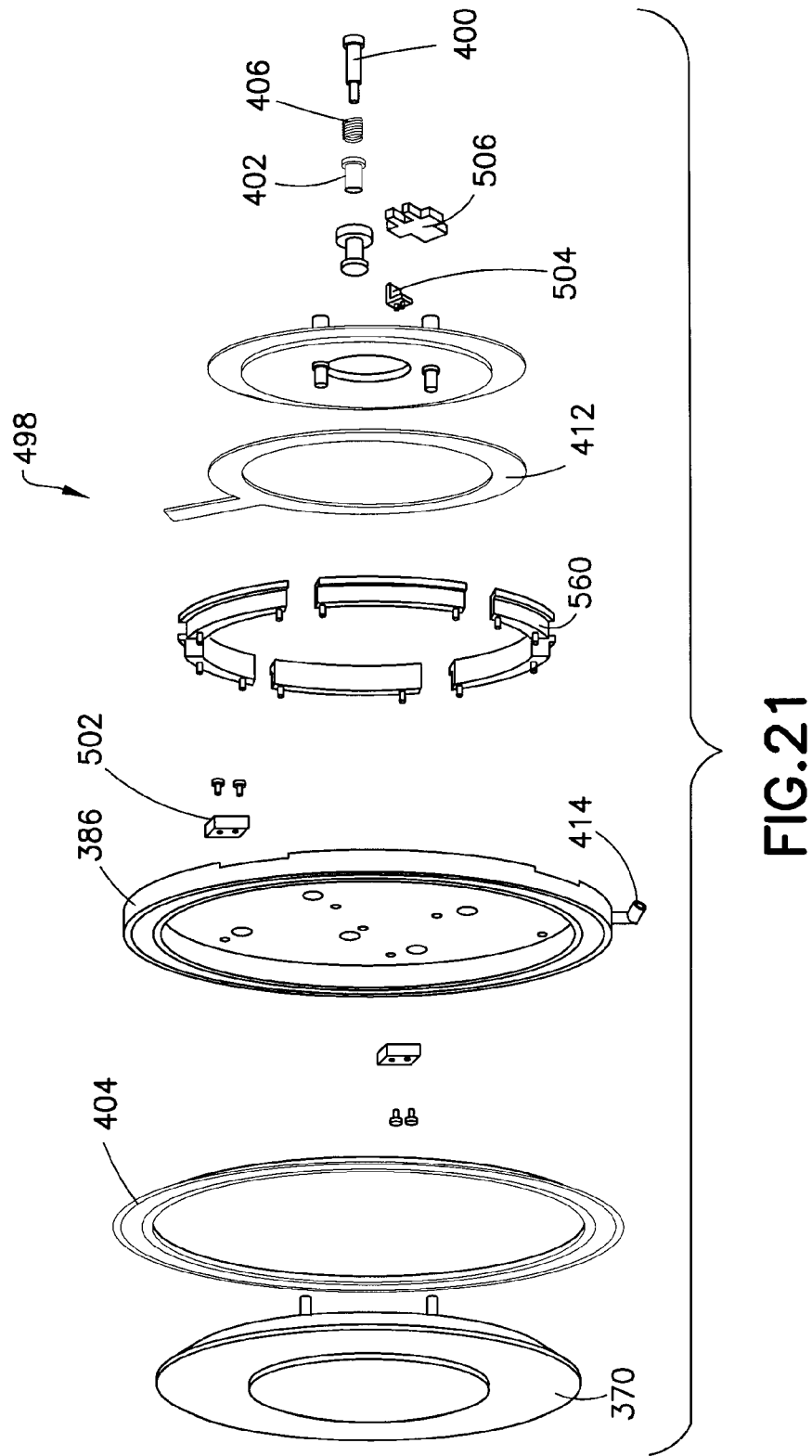

SUBSTRATE LOADER AND UNLOADER HAVING A BERNOULLI SUPPORT

RELATED APPLICATIONS

This application claims the benefit of and priority from U.S. Provisional Patent Application Ser. No. 61/504,942 Entitled "SUBSTRATE LOADER AND UNLOADER HAVING A BERNOULLI SUPPORT" and filed on Jul. 6, 2011, and U.S. Provisional Patent Application Ser. No. 61/504,920 entitled "SUBSTRATE LOADER AND UNLOADER HAVING AN AIR BEARING SUPPORT", filed on Jul. 6, 2011 and U.S. Provisional Patent Application Ser. No. 61/527,222 entitled "SUBSTRATE LOADER AND UNLOADER" and filed on Aug. 25, 2011 all of which are hereby incorporated by reference herein in their entireties. This application is related to U.S. patent applications, entitled "SUBSTRATE LOADER AND UNLOADER HAVING AN AIR BEARING SUPPORT", No. 61/504,920 and entitled "SUBSTRATE LOADER AND UNLOADER" No. 61/527,222 filed on the same date herewith which is hereby incorporated by reference herein in its entirety.

BACKGROUND

1. Field

The disclosed embodiments relate generally to a substrate loader and unloader and more specifically to a substrate loader and unloader having a Bernoulli support.

2. Brief Description of Related Developments

Fluid processing, among other processes, is used as a manufacturing technique for the application or removal of films and materials to various structures and surfaces, such as semiconductor wafers and silicon work pieces or substrates of varying materials. Fluid processing may require sealing or placing a substrate against for example an elastomeric surface during processing and subsequently removing the substrate from the elastomeric surface after one or more processing steps have been completed. Further, substrate processing may be done in a clean environment and requiring clean processing and transport. A problem arises when processing and transporting substrates in a clean environment where particulates and other contamination or damage may occur to the substrate by virtue of the process and/or transport method. Accordingly, there is a desire to provide fluid processing and transport of substrates while minimizing contamination and damage to the substrate.

BRIEF DESCRIPTION OF THE DRAWINGS

The foregoing aspects and other features of the embodiments are explained in the following description, taken in connection with the accompanying drawings.

FIG. 21 shows an exploded isometric view of a Bernoulli chuck assembly.

DETAILED DESCRIPTION OF THE EMBODIMENTS

Figure 1:
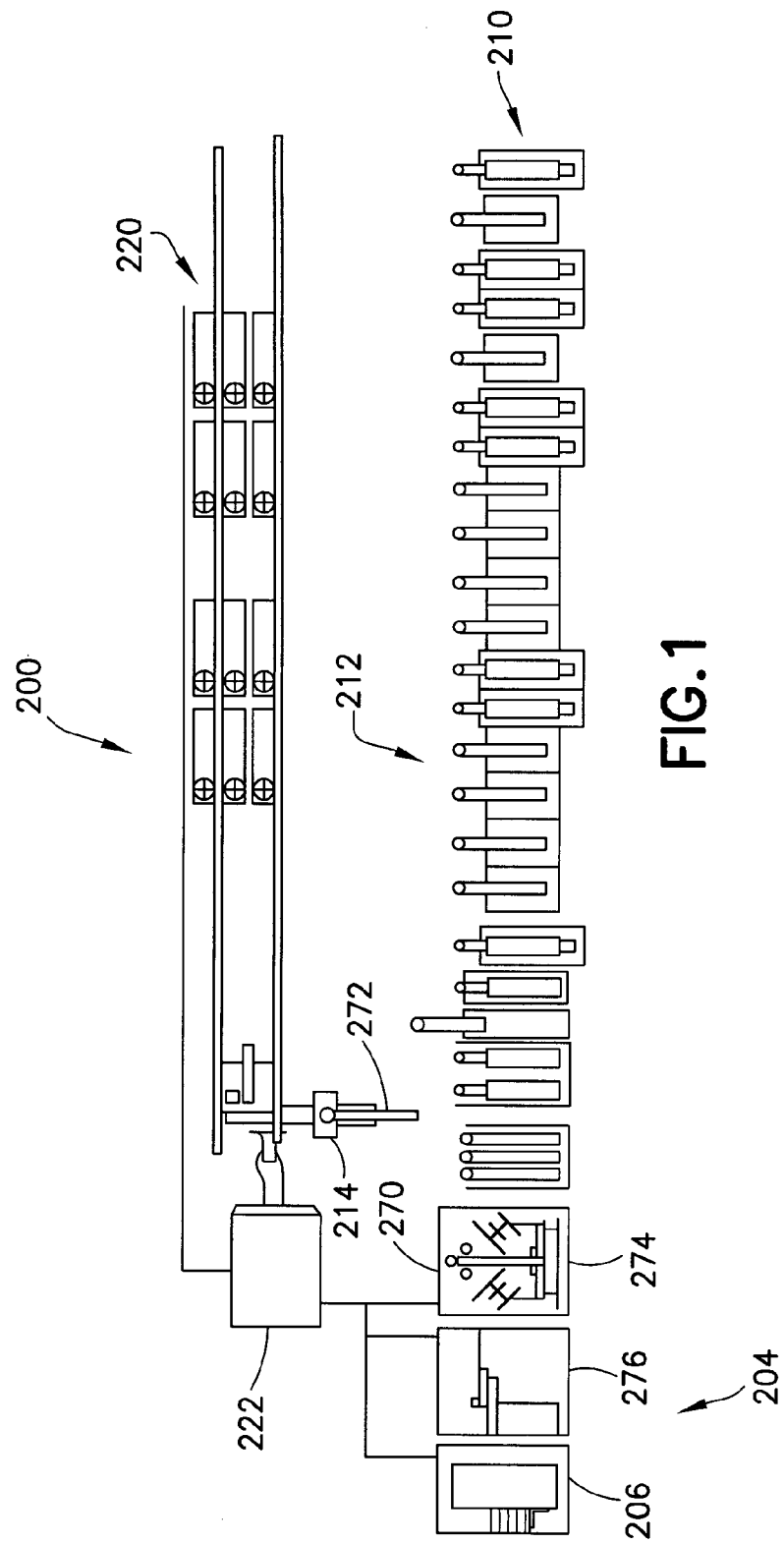
FIG. 1 shows an exemplary wafer processing system.

Although the present embodiments will be described with reference to the embodiments shown in the drawings, it should be understood that the embodiments can be embodied in many alternate forms of embodiments. In addition, any suitable size, shape or type of elements or materials could be used.

Figure 2:
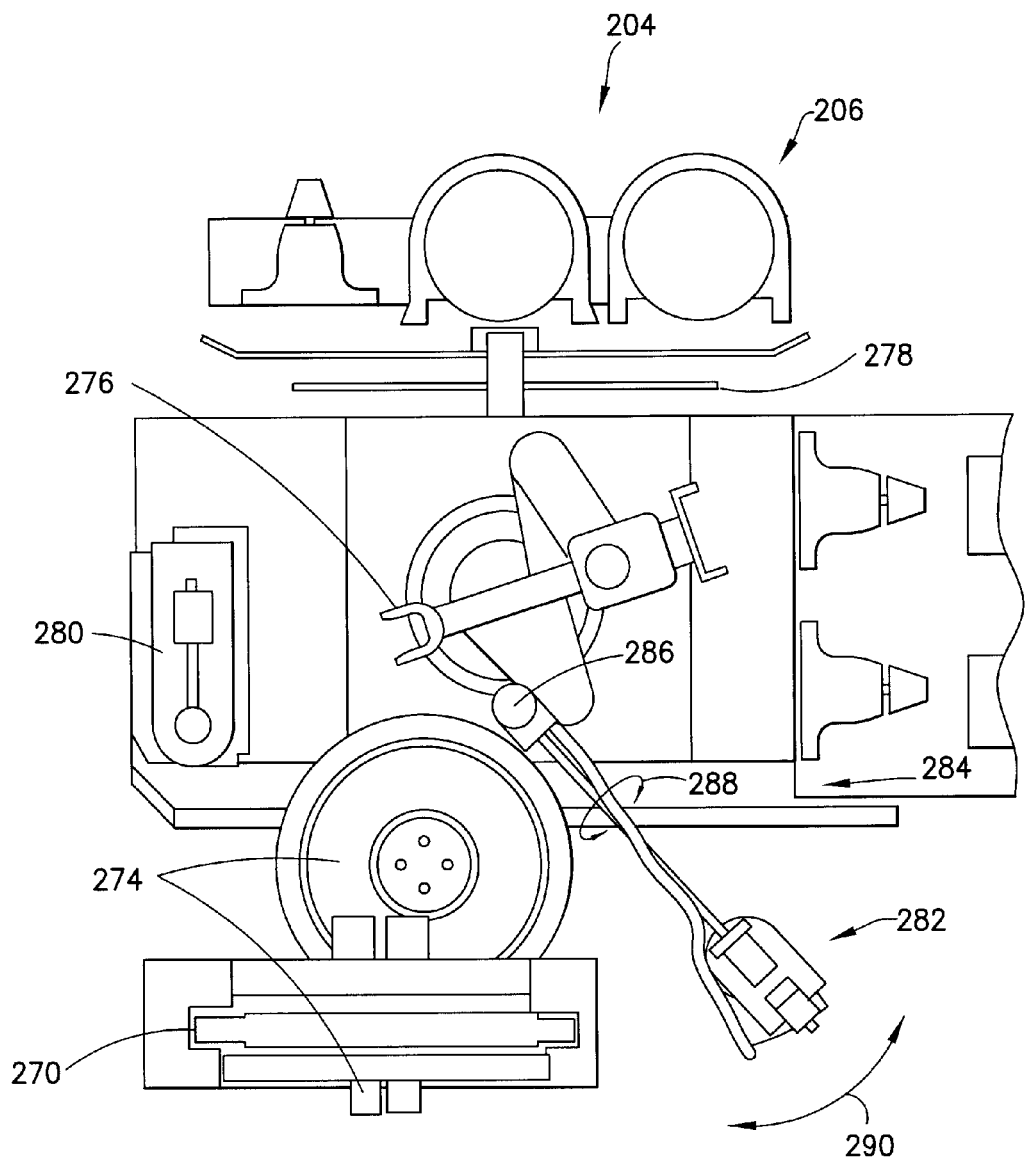
FIG. 2 shows a front end loading and unloading portion of an exemplary wafer processing system.

Referring now to FIG. 1, there is shown an exemplary wafer processing machine 200 suitable for a manufacturing process using the present disclosed embodiments. Referring also to FIG. 2, there is shown a front end loading and unloading portion 204 (also referred to herein as the loading station or front end loading station) of an exemplary wafer processing system 200. The disclosed embodiments may be implemented in an electroplating, cleaning or etching system and may be used in combination with an electro deposition machine such as the Stratus from NEXX Systems in Billerica Mass. System 200 and modules 210 may incorporate features as disclosed in the International Application WO 2005/042804 A2 published under the Patent Cooperation Treaty and having publication date May 12, 2005 and as disclosed in U.S. Publication No. 2005/0167275 published Aug. 14, 2005 and entitled method and apparatus for fluid processing a work piece, both of which are hereby incorporated by reference herein in their entirety. System 200 is shown as an exemplary system. In alternate embodiments, more or less modules may be provided having different configurations and locations. Machine 200 may contain load ports 206 by which substrates previously processed, such as being patterned with photoresist or otherwise processed are inserted and withdrawn from the system. Loading station 204 may have a robotic arm 276 which may selectively transfer substrates 278 to pre aligner 280, pick up and flip device 282 or buffer module 284. Pick up and flip device 282 has one or more vacuum chuck(s) 286 to grip the backside of substrate 278 and also has first 288 and second 290 rotation axis in addition to a vertical z axis to respectively invert and transport substrate 278 to and from wafer loader module 274 where wafer loader module 274 may load wafer(s) to holders 270, 272. Here, loader module 274 may have features as further described below and for gripping and releasing one or more wafers either in parallel or selectively of holder 270. In alternate embodiments, robotic arm 276 may transport a single wafer, a batch of wafers or a combination thereof. In alternate embodiments, more than one loader module 274 may be provided to load holders 270, 272 in parallel or to load wafers onto different types of holders where holders 270, 272 may have different features or be used for different types of processes. Although loader 274 will be described below in greater detail, it is understood that the disclosed embodiment chucks may be used in any Viton® suitable loading, unloading, transport or processing module (s). An example of holder 270 is disclosed in U.S. Pat. No. 7,445,697 Issued Nov. 4, 2008 and entitled Method and Apparatus for Fluid Processing a Work Piece which is hereby incorporated by reference in its entirety. In alternate embodiments, any suitable combination of holder(s) may be utilized within system 200. Process modules 210 may have features, for example, where modules 210 may be suitable for electroplating wafers, anodizing wafers, cleaning wafers, such as liquid stripping of photoresist, sed layer etching, general wafer cleaning or otherwise. By way of further example, in operation, cassettes (or FOUPs) of wafers are loaded into system 200 at front end loading station 204, individual wafers are loaded onto wafer holders 270 that hold wafers during processing where wafers, mounted in wafer holders, are transported within the wet process area 212 by wafer transporter 214. In wet-process area 212 wafers may be transferred through pre-treatment, rinse, and a sequence of alternating plating and rinsing steps or otherwise as defined by recipes. Controller(s) 220 may be provided within each station or module to sequence the process and/or transport within the station or module. A system controller(s) 222 may be provided within the system 200 to sequence substrates between the stations or process modules and to coordinate system actions, such as, host communication, lot loading and unloading or otherwise those actions that are required to control the system 200. In alternate embodiments, process modules 210 may include a combination of cleaning and electro deposition modules. In alternate embodiments, more or less modules in more or less suitable combinations may be provided in any suitable combination. As such, all such variations, alternatives and modifications of system 200 configurations are embraced.

Figure 3:
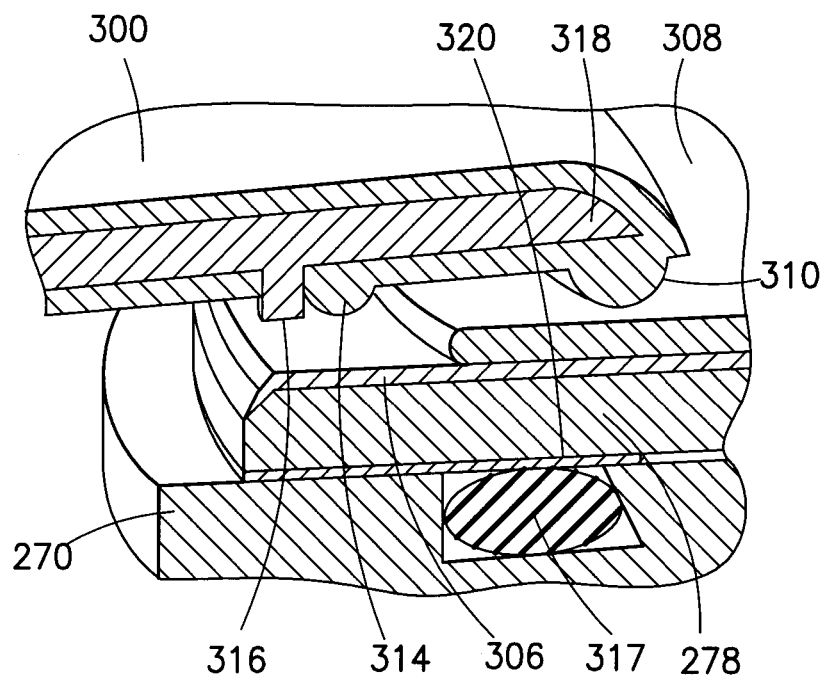
FIG. 3 shows a contact ring seal.
Figure 4:
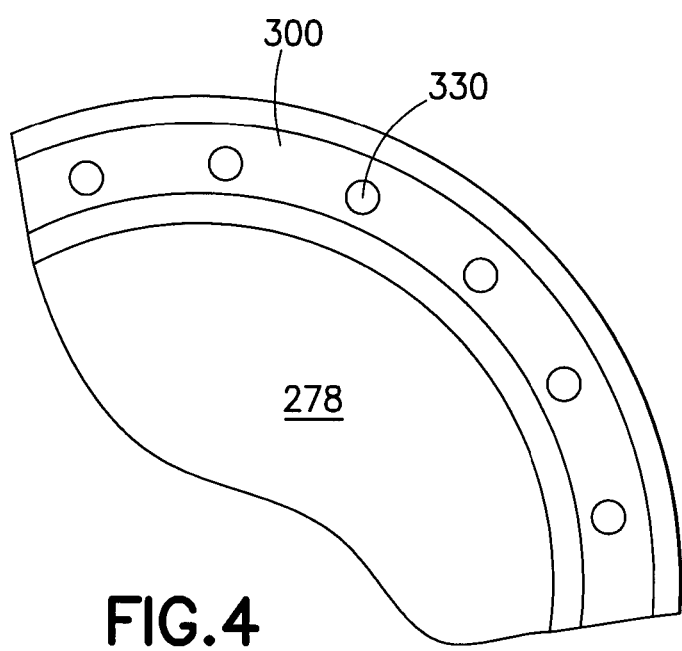
FIG. 4 shows a contact ring seal.
Figure 5:
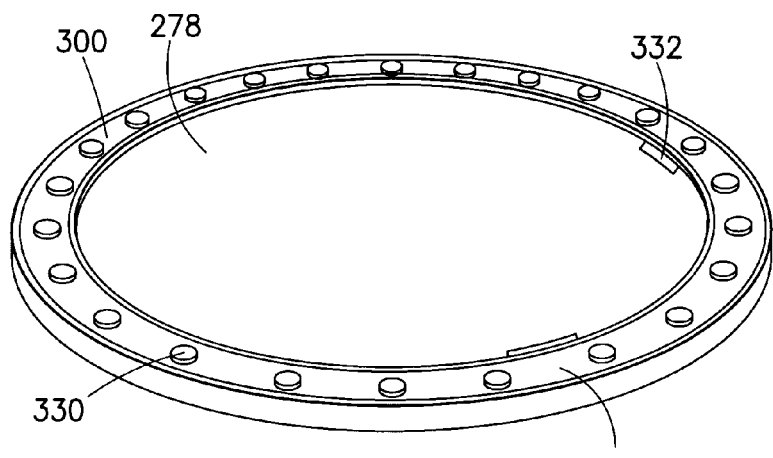
FIG. 5 shows a contact ring seal.
Figure 6A:
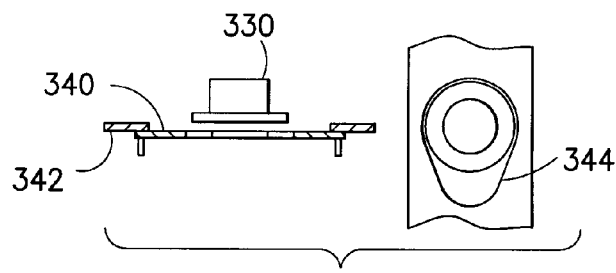
FIG. 6A shows a contact ring seal lock pin and spring plate.
Figure 6B:
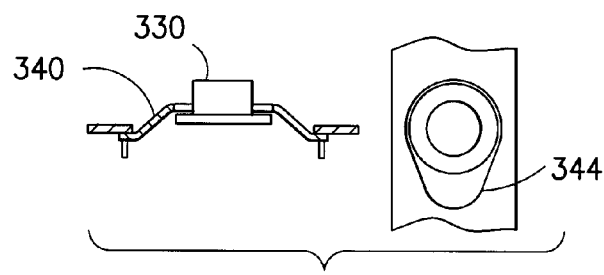
FIG. 6B shows a contact ring seal lock pin and spring plate.
Figure 6C:
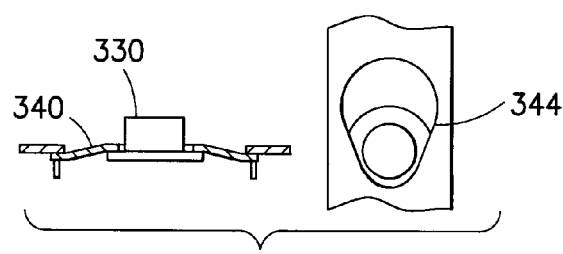
FIG. 6C shows a contact ring seal lock pin and spring plate.

Referring now to FIG. 3, there is shown an exemplary sealing portion referred to herein for description purposes as a contact ring seal 300. Referring also to FIG. 4, there is also shown contact ring seal 300. Referring also to FIG. 5, there is also shown contact ring seal 300. As may be realized, the contact ring seal is configured to be coupled to the holder frame and capture the substrate to the holder. A suitable example of a contact ring seal is described and shown in U.S. Pat. No. 6,540,899, Issued Apr. 1, 2003. In alternate embodiments any suitable contact ring seal may be used. In the embodiment shown, substrate 278 may have seed layer 306 and resist layer 308. With respect to FIG. 3, contact ring seal 300 is assembled to and coupled to holder 270 where contact ring seal 300 seals with primary seal 310 to photoresist layer 308 and secondary seal 314 to seed layer 306 where the seal material may be Viton® or any suitable material. Spaced electrical contacts 316 distribute electrical contact evenly around the circumference of wafer 278 and may provide a mechanism 318 to axially stiffen contact ring seal 300 for effective sealing of seal 310 where contacts 316 may be substantially embedded within the Viton® or otherwise. O-ring 318 may be provided within holder 270 to provide an additional seal on the wafer backside around the circumference of wafer 278 within edge exclusion zone 320. Lock pins 330 may be provided around the circumference of contact ring seal 300 where lock pins 330 engage key holes in holder 270 as will be described in greater detail below. One or more alignment bosses 332 may be provided on contact ring seal 300 to provide alignment, for example as shown with respect to FIG. 5, where, for example, substrate 278 is supported by a Bernoulli chuck as will be described and tilted or otherwise to drive substrate 278 against alignment bosses 332. In operation, one or more wafers 278 may be mounted to wafer holder 270 by a temporary, leak-proof seal 310 around the full circumference of wafer 278 where the sealing force may be created such as by a flexure, for example, an annular spring or otherwise. In the exemplary embodiments where springs 340, as seen in FIG. 6A-6C, may be embedded within each wafer holder 270 where spring force may be maintained locally inside each wafer holder independent of the rest of the process tool. Here, wafers 278 may remain sealed to wafer holders 270 during all phases of processing. In the embodiment shown, sealing may be 100% tested prior to processing. Here machined features may be provided on wafer holder 270 to positively align wafers as they are presented to each process module where no additional physical adjustment may be required once inserted into a module. In the embodiment shown, wafer holder 270 may provide a source of gripping wafers for transport that avoids contact with the wafer surface where wafer holder 270 in cooperation with contact ring seal 300 may act as the active cathode during electrochemical deposition (ECD) or otherwise.

Referring now to FIG. 6A, there is shown a contact ring seal lock pin and spring plate. Referring also to FIG. 6B, there is shown a contact ring seal lock pin and spring plate. Referring also to FIG. 6C, there is shown a contact ring seal lock pin and spring plate. In the embodiment shown, spring plate 342 is provided within holder 270 where spring plate has flexures 340 and keyholes 344 that engage lock pins 330 in contact ring seal 300. In FIG. 6A, lock pin 330 is aligned with a portion of keyhole 344 that has clearance to allow keyhole 344 to axially move past the shoulder of lock pin 330 when air pressure or otherwise within holder 270 expands flexures 340 of spring plate 340 as seen in FIG. 6B. As seen in FIG. 6C, contact ring seal 300 may be rotated by loader 274 as will be described below to engage a portion of keyhole 344 that interferes with the shoulder of lock pin 330 where flexures 340 axially preload the seals associated with contact ring seal 300 when air pressure is relieved allowing spring plate 342 to retract engaging the key holes 344 with the shoulders of lock pins 330 thus retaining substrate 278 within holder 270 during transport and processing.

Figure 7:
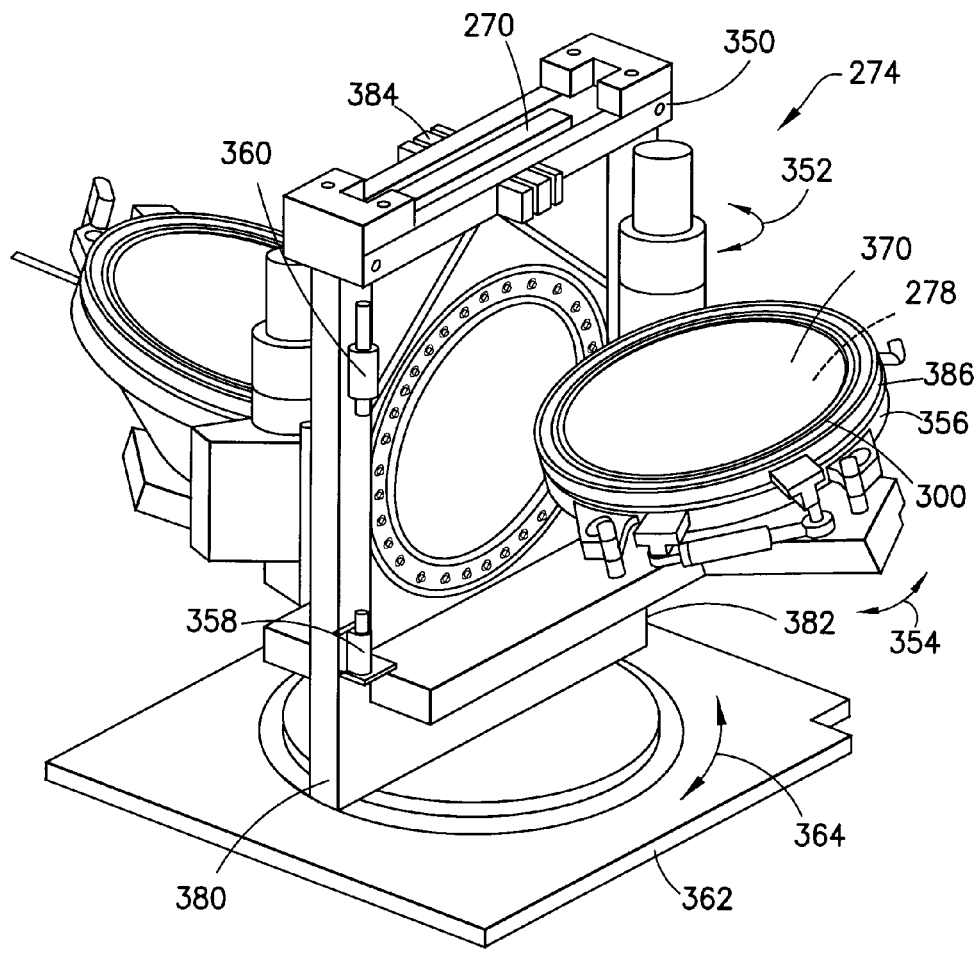
FIG. 7 shows an auto loader and unloader.

Referring now to FIG. 7, there is shown an exemplary auto loader and unloader 274 and exemplary holder 270. Auto-loader 274 may mount individual wafers onto wafer holders before they are processed and may dismount wafers after processing is complete. In the embodiment shown, holder 270 may hold two substrates on opposing sides of holder 270 where loader 274 may have two opposing loading and unloading features as shown. By way of example, coupled to frame 350 may be swing axis 352, tilt axis 354 perpendicular to swing axis 352, door assembly 356 and door clamps 358, 360 where frame 350 may have guidance and locating features, such as align strips 380, 382 to positively locate holder 270 with respect to frame 350. As will be described in greater detail below, chuck assembly 370 may be provided within door assembly 356 where the combination of door assembly and chuck assembly 370 may have one or more features allowing chuck assembly to be axially moved relative to tilt axis 354. Frame 350 may be rotationally coupled to base 362 by spin axis 364. In the embodiment shown, each of the respective axis may be servo controlled or otherwise controlled to selectively position chuck assembly 370 with respect to base 362 and holder 270. In the embodiment shown, loader 274 is merely exemplary where, by way of example, the features of chuck 370 and/or door 356 may be used in any suitable handling, transport or process application or otherwise. In the embodiment shown, loader 274 may use chuck 370 that handles substrates in a noncontact fashion as described below, for example, during transport and during engagement and disengagement with contact ring seal 300 and holder 270 where chuck 370 facilitates de-sticking of seals without contact between substrate 278 and chuck 370. Here, chuck assembly 370 mounts into door assembly 356 where door assembly 356 handles both the wafer and contact ring seal interface. In the embodiment shown, door assembly 356 may functionally align wafers against an alignment feature, for example, on seal, alignment bosses or otherwise. Further door assembly 356 may functionally hold the wafer in a fixed location while being loaded onto the holder via the loader and may engage/disengage and lock/unlock the contact ring seal with respect to the wafer holder. In operation, tilt axis 354 rotates substrate 278 from a horizontal attitude to a vertical attitude where swing axis 352 rotates door assembly 356 into a position with chuck 370 parallel to the wafer or contact ring seal engagement surface of holder 270. The position of door assembly 356 is locked with respect to frame 350 where two cylinders or other suitable devices 358, 360 on align strip 380 opposing align strip 382 engage door assembly 356 forming a rigid three point coupling between the align strips 380, 382 and door assembly 356. An exemplary unloading operation begins where transporter 214 loads holder 270 having a wafer into frame 350 and a service connection 384 for air, nitrogen or otherwise is actuated. With door assembly 356 in a closed (e.g.) vertical position and locked by features 358, 360, vacuum ring 386 and chuck 370 within door 356 are axially moved toward holder 270 where vacuum ring 386 grips contact ring seal 300. The spring plate within holder 270 is actuated and vacuum ring 386 and chuck 370 within door 356 are rotated to disengage the lock pins from the keyholes. Vacuum ring 386 and chuck 370 within door 356 are axially moved away from holder 270 where vacuum ring 386 extracts contact ring seal 300 from holder 270 and where chuck 370 extracts substrate 278 from holder 270 without contact. In the exemplary embodiment controller 222 may be programmed so that vacuum ring 386 and chuck 370 may effect extraction of the contact seal ring and substrate 278 together as a unit from the holder 270, as will be described further below. Clamps 358, 360 are released and the door assembly rotated by swing axis 352 and rotated to a horizontal attitude by tilt axis 354. As will be described, substrate 278 is separated from contact ring seal 300 in a de-stick operation, effected by the controller, without chuck 370 contacting substrate 278 by moving chuck 370 axially relative to vacuum ring 386 separating substrate 278 from contact ring seal 300. In operation, during load and unload sequences, chuck 370 may be angled with respect to horizontal, for example, to provide for alignment of substrate 278 with alignment bosses 332 on contact ring seal 300. Pick up and flip device 282 removes a processed or dummy substrate 278 from loader 274 and may provide an unprocessed or other substrate for loading where the loading sequence may be opposite the unloading sequence or otherwise. The disclosed embodiments overcome seal to wafer interface stiction in the loader with chuck 370 that may alternately be applied elsewhere and in other applications where chuck 370 may be applied to overcome adhesion forces between the wafer and contact ring seal that seals the peripheral edge of the wafer within the edge exclusion zone and isolates the backside of the wafer from process chemistry during processing. Here, wafers may tend to stick to the seal (stiction) and may pop or create particles when the two are improperly separated and disengaged. The disclosed embodiments may be applied generally to sealing surfaces and substrates.

Figure 8:
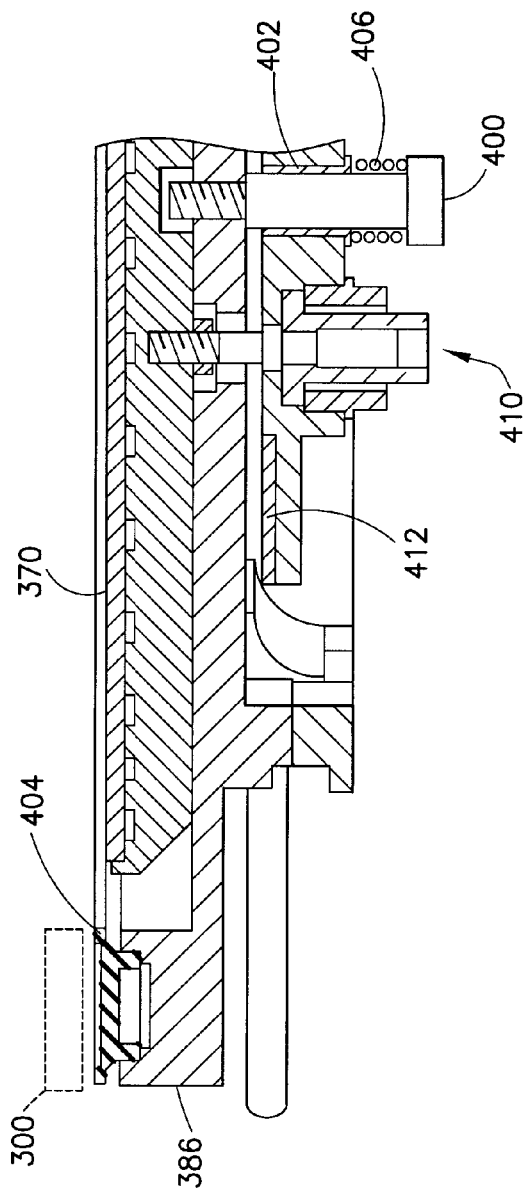
FIG. 8 shows a retracted Bernoulli chuck.
Figure 9:
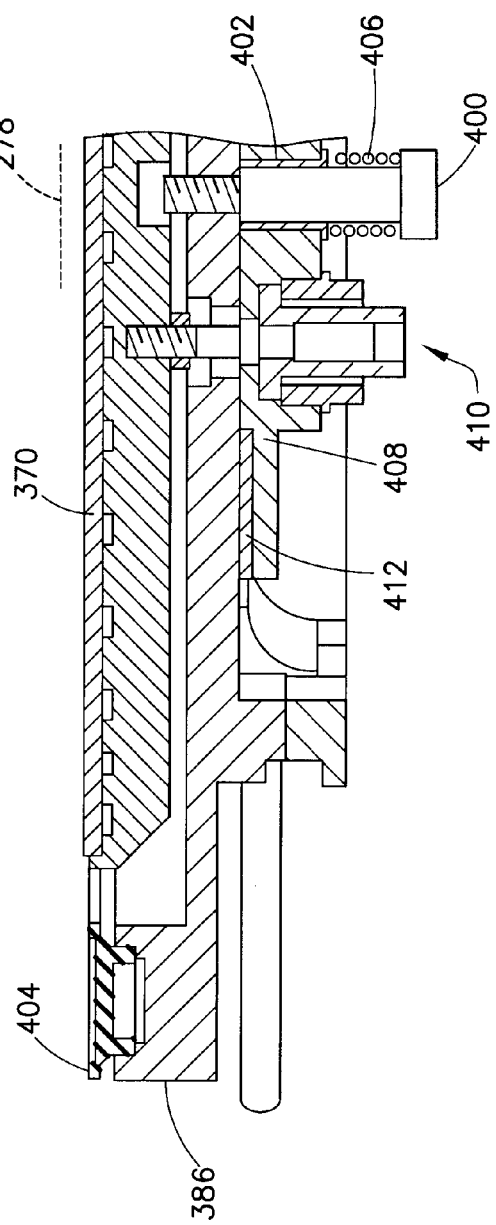
FIG. 9 shows an extended Bernoulli chuck.
Figure 10:
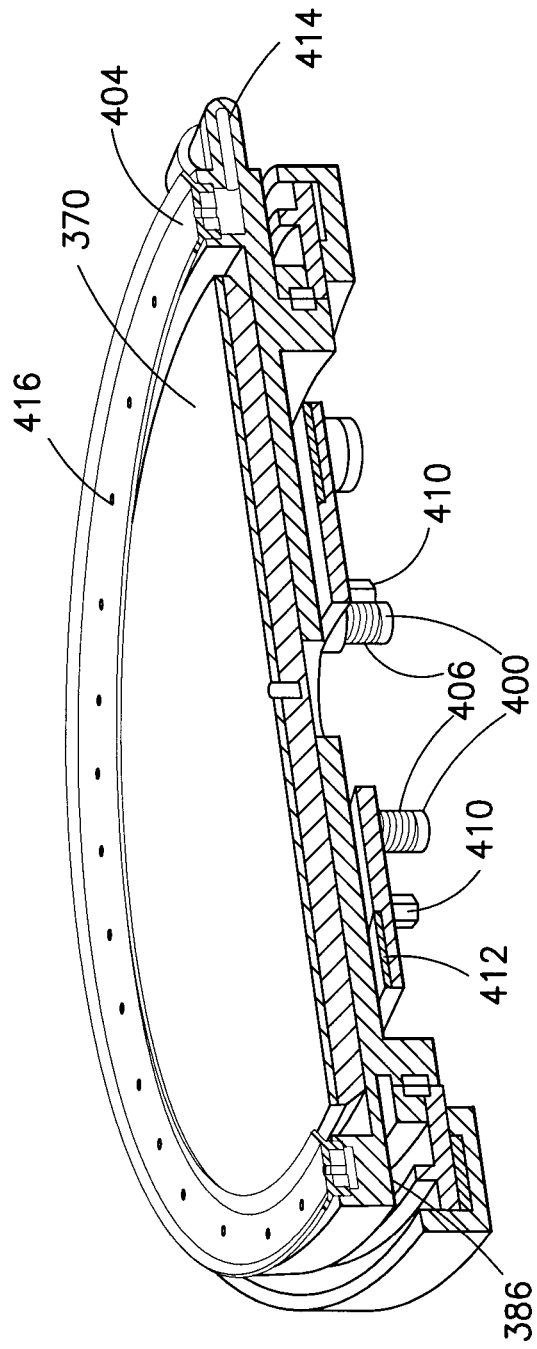
FIG. 10 shows a cross section of a Bernoulli chuck.
Figure 12:
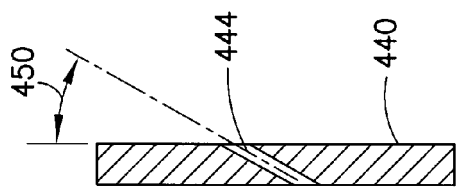
FIG. 12 shows a section view of a port in a Bernoulli chuck.

Referring now to FIG. 8, there is shown a portion of the door assembly with Bernoulli chuck in a retracted position (down or inward in the frame of reference of FIG. 8). Referring also to FIG. 9, there is shown Bernoulli chuck in an extended (up or outward) position. In the embodiment shown, chuck 370 is axially moveable with respect to contact ring seal vacuum ring 386. Shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly, for example, during a de-stick operation where the face of chuck assembly 370 remains substantially parallel with the suction and locating feature 404 of ring assembly 386 during motion regardless of the orientation or location of the origin of a de-stick between a substrate and a contact ring seal held by feature 404 and regardless of the propagation of the de-stick. In alternate embodiments, any suitable mechanism, such as combinations of slides, bushings or any suitable guide or otherwise may be provided to constrain chuck assembly 370 substantially parallel with ring assembly 386 during motion. Referring also to FIG. 10, there is shown a cross section of the door assembly and Bernoulli chuck plate 370 where contact ring seal vacuum ring 386 (seated on the support surface of the door frame) is provided with a Viton® vacuum ring 404, contact ring seal vacuum ports 416, Bernoulli and contact ring seal vacuum supply 414. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the extended or up position as shown in FIG. 9 which corresponds to a position where bladder 412 is deflated. Alternately, where bladder 412 is inflated, chuck 370 is axially moved to the retracted location shown in FIG. 8. A similar guidance and constraint approach is provided for engagement of the contact ring seal assembly with the holder utilizing a secondary bladder as described below. In the embodiment shown, FIG. 9 shows chuck 370 extended or up whereas FIG. 8 shows chuck 370 retracted or down where the wafer may be initially placed by the pick up and flip device on the contact ring seal with chuck 370 retracted as seen in FIG. 8. In application, bladder 412 (under suitable control from controller 222) moves chuck 370 axially where filling bladder 412 retracts chuck 370 as seen in FIG. 8. This disengages the wafer to contact ring seal 300 and wherein emptying bladder 412, in combination with spring return 406, provides a damped motion that engages chuck with wafer 278 and separates wafer 278 from seal 310 of contact ring seal 300. Nitrogen filtered gas may be further provided as the media for chuck 370. As such a first Bernoulli condition exists as in FIG. 8 where the chuck 370 is retracted with Bernoulli gas flow, suction holds the wafer down against the contact ring seal 310 and a second Bernoulli condition exists as in FIG. 9 where the chuck 370 is extended with Bernoulli gas flow, there is gap between the wafer and the chuck with the wafer floating on an air bearing cushion with seal 310 and wafer 278 separated where a de-stick condition exits but also where wafer 278 is still engaged with the alignment bosses on contact ring seal 300. The condition in FIG. 8 may further be referred to as Bernoulli mode where chuck 370 is retracted with nitrogen on where wafer 278 is on the contact ring seal seals 310 and the suction has purposes including rotation of the wafer from horizontal to vertical or during translation or otherwise. The condition in FIG. 9 may further be referred to as air bearing mode where chuck 370 is extended with nitrogen on where a gap exists between chuck 370 and wafer 278 where wafer 278, for example, may drive to contact ring seal location bosses, for example by gravity for location against the bosses to keep the nitrogen flow down for particle concerns but any suitable combination of Bernoulli force, gravity or otherwise may be used.

Figure 11:
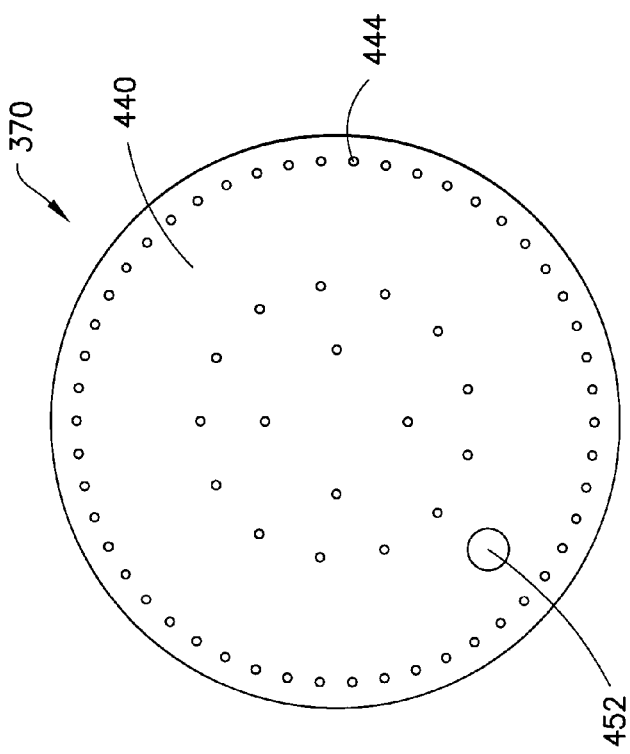
FIG. 11 shows a top view of a Bernoulli chuck.
Figure 25:
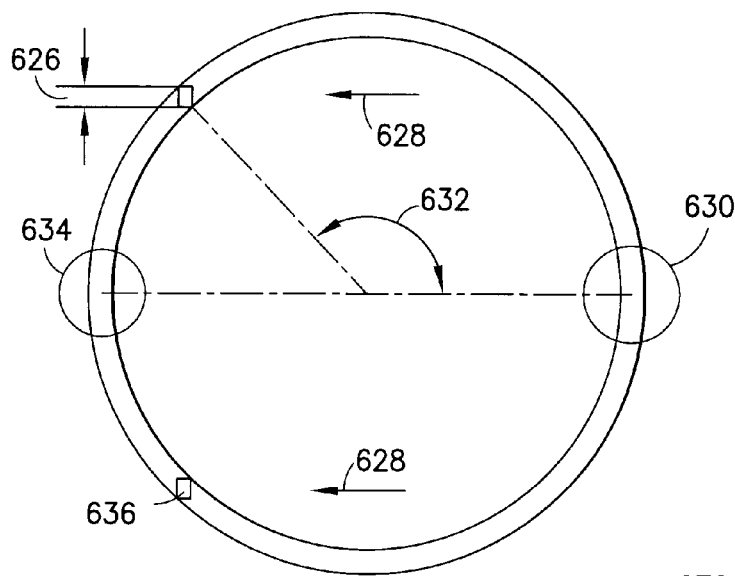
FIG. 25 shows a top view of a peel interface.

In the embodiment shown, substrate separation or transport chuck 370 is shown that may separate and transport substrate 278 from an adhering surface such as a seal provided by ring seal 300 or vacuum ring 404. Support 386 is shown gripping or supporting adhering surface or seal 404. Alternately, substrate support 386 may have an integral seal to support substrate 278. Here, the seal such as a seal provided by ring seal 300 or vacuum ring 404 may be a peripheral edge seal to seal a peripheral edge of substrate 278. In alternate embodiments, any suitable seal or adhering surface in any suitable shape may be provided. Bernoulli chuck surface 370 is shown to support substrate 278 with Bernoulli chuck surface 370 axially moveable relative to support 386, for example, moveable between the position shown in FIG. 8 to that shown in FIG. 9. Bernoulli chuck surface 370 may have a first position as seen in FIG. 8 adjacent substrate 278 with substrate 278 coupled to adhering surface such as a seal provided by ring seal 300 or vacuum ring 404. Bernoulli chuck surface 370 is shown moveable from the first position in FIG. 8 to a second position in FIG. 9 separating substrate 278 from adhering surface such as a seal provided by ring seal 300 or vacuum ring 404 without contact between substrate 278 and Bernoulli chuck surface 370. In the embodiment shown, a mechanism is provided to separate substrate 278 from sealing surface such as a seal provided by ring seal 300 or vacuum ring 404 and having retaining support structure 386 that may grip sealing surface such as a seal provided by ring seal 300 or vacuum ring 404 and with a moveable central chuck 370 positioned within retaining support structure 386 with moveable central chuck 370 having a Bernoulli effect portion or surface. Controller 222 may be configured for providing one or more predetermined combinations of air bearing pressure and partial vacuum caused by Bernoulli gas flow of the Bernoulli effect portion to generate a non-contact force on substrate 278. Here, the non-contact force overcomes adhesive forces between sealing surface such as a seal provided by ring seal 300 or vacuum ring 404 and substrate 278 where the non-contact force transports and positions substrate 278 with moveable central chuck 370, for example, between the position shown in FIG. 8 and that of FIG. 9. In the embodiment shown, Bernoulli chuck surface 370 and peripheral edge seal 300 are shown relatively moveable from a first position as seen in FIG. 8 with substrate 278 contacting peripheral edge seal such as a seal provided by ring seal 300 or vacuum ring 404 to a second position as seen in FIG. 9 with substrate 278 not contacting peripheral edge seal 300. Here, substrate 278 is adhered to peripheral edge seal 300 when contacting peripheral edge seal 300 where Bernoulli chuck surface 370 effects separation of substrate 278 from peripheral edge seal 300 when transitioning from the first position as seen in FIG. 8 to the second position as seen in FIG. 9. Here Bernoulli chuck surface 370 may effect the separation of substrate 278 from peripheral edge seal 300 without Bernoulli chuck surface 370 contacting substrate 278. Here, Bernoulli chuck surface 370 and substrate support 386 are movably coupled having a first position as seen in FIG. 8 with substrate 278 contacting substrate support 386 and a second position as seen in FIG. 9 with substrate 278 not contacting substrate support 386. Here, substrate 278 is attracted to substrate support 386 and Bernoulli chuck surface 370 by Bernoulli chuck surface 370 when substrate is contacting substrate support 386 and with Bernoulli chuck surface 370 in the first position as seen in FIG. 8 where support 386 may have seal 300 and where substrate 278 may be adhered to seal 300. Substrate 278 may be repelled from substrate support 386 and separated from substrate support 386 and hence seal 300 by Bernoulli chuck surface 370 when Bernoulli chuck surface 370 transitions from the first position as seen in FIG. 8 to the second position as seen in FIG. 9. Here, Bernoulli chuck surface 370 transitions from the first position to the second position without Bernoulli chuck surface 370 contacting substrate 278. Bernoulli chuck surface 370 may be constrained to remain substantially parallel to adhering surface or seal, e.g., 300. In one embodiment, Bernoulli chuck surface 370 may have a Bernoulli hole pattern that is axisymmetric. As seen in FIG. 11, in one embodiment Bernoulli chuck surface 370 has a Bernoulli hole pattern 444 that increases lift at an outer edge of Bernoulli chuck surface 370 as compared to a center of Bernoulli chuck surface 370. In the embodiment shown, Bernoulli chuck surface 370 is axially moveable relative to the support with a predetermined motion profile. Here, substrate 278 is attracted and may be adhered to adhering surface 300 and Bernoulli chuck surface 370 by suction of Bernoulli chuck surface 370 when in the first position as seen in FIG. 8 where substrate 278 floats on a cushion of gas on Bernoulli chuck surface 370 when in the second position as seen in FIG. 9. Bernoulli chuck surface 370 may be constrained to remain substantially parallel to adhering surface such as a seal provided by ring seal 300 or vacuum ring 404 regardless of a de-stick propagation location as seen in FIG. 25 between substrate 278 and adhering surface or seal, e.g., 300 while substrate 278 is separating from the adhering surface or seal, e.g., 300. Bernoulli chuck surface 370 may be moved from the first position to the second position by a force applied by a preloaded spring 406 and damped between Bernoulli chuck surface 370 and adhering surface or seal 300. In one embodiment and as seen in FIG. 11, the Bernoulli chuck surface may have an outer annular region having a higher gas flow as compared to an inner annular region of Bernoulli chuck surface 370 where the outer annular region provides a stiffer interface between the substrate and the Bernoulli chuck surface as compared to the inner annual region. In alternate embodiments, more or less features may be provided.

One or more de-stick operations may be done after process operations during unload of processed wafers where a second de-stick operation may be used to remove wafer 278 from wafer holder 270. Here, de-stick #1 may be removing wafer 278 from wafer holder 270 (see e.g. FIG. 3, O-ring 317 on holder seal 318) and de-stick #2 may be removing wafer 278 from the sealing ring 300. Stiction may come from different sources. For example, some wafer holders may have o-rings, gaskets or seals 317 within them in addition to the contact ring seal 310 which may adhere to the wafer and prevent proper handling. Potential sources of wafer holder or contact ring seal sticking sources and causes which may require de-sticking may by way of example include: heat and pressure over time; sealing o-rings or seals that wafer 278 seals against;

suction effects such as local vacuum due to mechanical flexure or otherwise; polymeric materials; flat surfaces interaction and related vacuum effects; residual chemistry; electrostatic forces; Van der Waals forces; variations in coatings or materials; time variations of materials due to chemistry or otherwise; time variations of sticking force (set, contact area . . . ); tack and stiction in general or otherwise. As such, a de-sticking operation and the related forces and interactions while able to be bounded may not be necessarily predictable. Therefor, chuck 370 is provided with a controllable non contact force in combination of a force and motion profile that may be stored in controlled memory and effected by suitable controller programming that provides de-stick without contact over a range of desired conditions. In the embodiment shown, the force applied to substrate 278 for de-stick may increase inversely with respect to the gap thickness. Here, air bearing force (lift) applied by chuck 370 may be inversely proportional with gap where Bernoulli force (suction) may be zero at zero gap, and may increase (absolute value/magnitude) to a negative maximum at a given gap and decreasing (magnitude) toward zero as gap increases. Further, gravity offsets or adds to the Bernoulli force depending upon attitude of the substrate. Hence, the net force applied to wafer 278 may include gravity, Bernoulli force, air bearing force+external forces (seal, pressure differential or otherwise) with a net effect being where chuck 370 gets closer to wafer 270, air bearing force gets larger. As will be shown below, for example in FIGS. 24-26, stiction forces to be overcome may not necessarily be distributed uniformly around the edge of the wafer and may be axis symmetric or otherwise. As such, chuck 370 may have a diameter close to that of the wafer for mechanical advantage and moment arm. In the exemplary embodiment, the diameter of the chuck as well as the hole pattern may be configured as desired, particularly at the edge, to provide the chuck diameter as large as possible and consistent with desired Bernoulli force and while allowing the Bernoulli gas flow to exit between the edge of the wafer and the ring portion of the contact ring seal. In the embodiment shown, the chuck geometry and springs in combination with flow out of bladder 412 generates a motion profile of the chuck 370 in combination with a force profile on the wafer. Here, to lift chuck 370 as in FIG. 9, springs 406 lift chuck 370 and offset bladder force and venting where restriction (tubing, valve, otherwise) Cv value sets the rate at which bladder 412 deflates. Here, motion rate and damping may be set by flow restriction or otherwise. Here, the geometry of chuck 370 and the mechanism by which the chuck plate is moved results in a force and time profile applied to the wafer which allows de-stick without contact or losing the wafer, for example, where the wafer may move past the align bosses but does not based on the chuck 370 retention characteristics.

Figure 13:
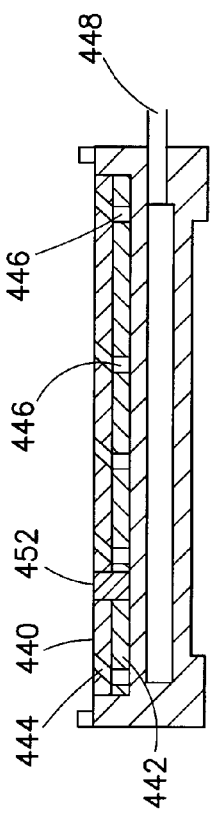
FIG. 13 shows a side section view of a Bernoulli chuck.

Referring now to FIG. 11, there is shown a top view of a representative Bernoulli chuck or Bernoulli plate. Referring also to FIG. 11, there is shown a section view of a port in a Bernoulli chuck. Referring also to FIG. 13, there is shown a side section view of a Bernoulli chuck. An exemplary Bernoulli chuck with a uniform large lift air bearing at the outer edge is seen in FIG. 11 showing an exemplary hole distribution, size and design. The back of chuck 370 may have uniform pressure nitrogen, for example, approximately 5 psi to 60 psi or otherwise; where 15 psi or otherwise may be typical. In the embodiment shown, chuck surface 440 may be made from 0.031" titanium or any other suitable material or thickness. Chuck 370 has surface 440 with Bernoulli holes 444, manifold or backing plate 442 with ports 446 in communication with holes 444 and nitrogen supply 448 in communication with ports 446 and holes 444. An optical or other presence or location sensor 452 may be provided to detect presence or location of substrate 278. In the exemplary embodiment shown, holes 444 in the Bernoulli chuck 370 may be substantially uniformly distributed. By way of example, a symmetric/axisymmetric hole pattern may be optimized for de-sticking. Here, there may be more holes, larger diameter holes or a different pressure on an outer radial region of the chuck, for example, a gradient may be provided radially with nitrogen flow increasing toward on the outer diameter. The hole pattern may be slightly non-symmetric, in azimuth or otherwise, for example to bias the wafer in one direction or another, for example, less holes may be on the lower or upper half or portion as an alternative. Hole angle 450 may be about 30 degrees or otherwise where holes 444 may point in a single or multiple directions, for example, pointing radially or otherwise. As seen in FIG. 11, multiple annular regions of holes 444 may be provided, for example, where the outer diameter region operates as a de-stick region and may be optimized to maximize mechanical advantage for de-stick. Further, intermediate diameter region(s) may be provided for uniform air bearing over the central region of the wafer. Finally, the center region may prevent contact of the wafer in the center by bowed (smile) wafers or otherwise.

Figure 14:
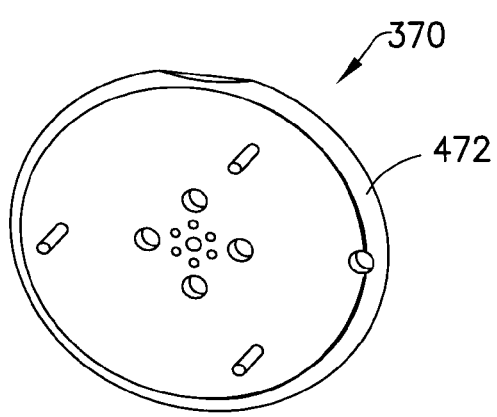
FIG. 14 shows an isometric view of a Bernoulli chuck plate.
Figure 15:
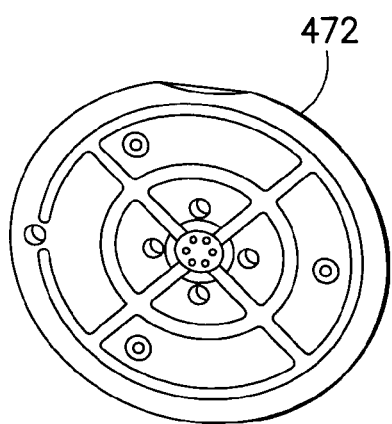
FIG. 15 shows an isometric view of a Bernoulli chuck plate.
Figure 16:
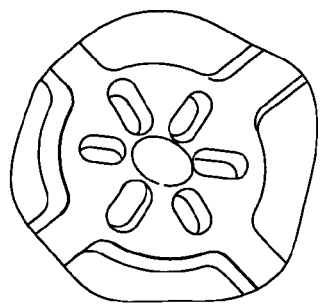
FIG. 16 shows an isometric view of a Bernoulli chuck plate.
Figure 17:
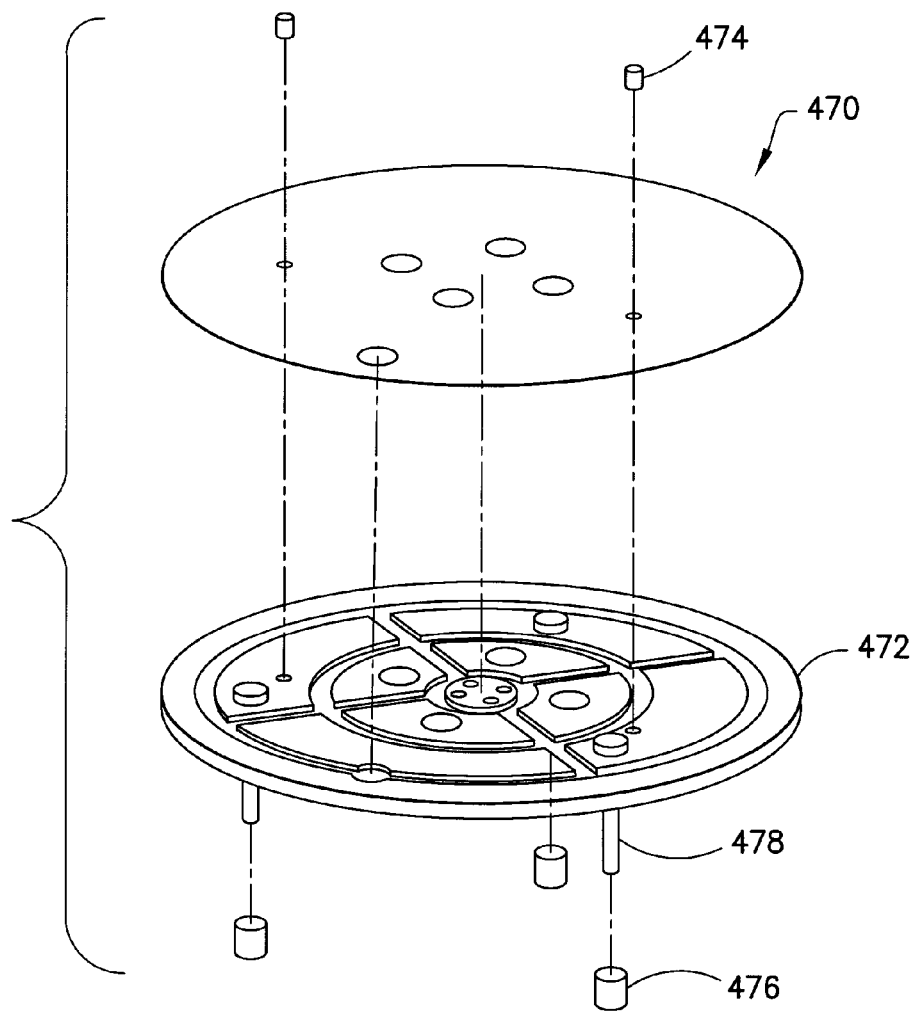
FIG. 17 shows an exploded view of a Bernoulli nozzle plate assembly.
Figure 18:
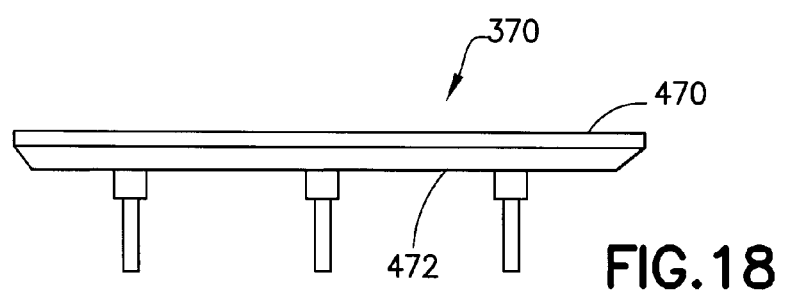
FIG. 18 shows a side view of a Bernoulli nozzle plate assembly.

Referring now to FIG. 14, there is shown an isometric view of a representative Bernoulli chuck plate. Referring also to FIG. 15, there is shown an isometric view of a Bernoulli chuck plate. Referring also to FIG. 16, there is shown an isometric view of a Bernoulli chuck plate. Referring also to FIG. 17, there is shown an exploded view of a Bernoulli nozzle plate assembly. Referring also to FIG. 18, there is shown a side view of a Bernoulli nozzle plate assembly. In the embodiment shown, Bernoulli chuck nozzle plate 470 may be fastened to manifold or Bernoulli chuck plate 472 by epoxy or otherwise, for example epoxied using Loctite™ hysol E-60HP or other suitable adhesive or fastening technique. In the exemplary embodiment shown, manifold 372 has multiple annular regions corresponding to holes on plate 472. In alternate embodiments, fewer or more regions may be provided, for example, where multiple regions have separate nitrogen supplies or different pressures or otherwise. Dowell pins 474 may be provided for angular location of plate 470 with respect to manifold 472. Sleeve bearings 476 and studs 478 may be provided as a mechanism to fasten and level chuck 370.

Figure 20:
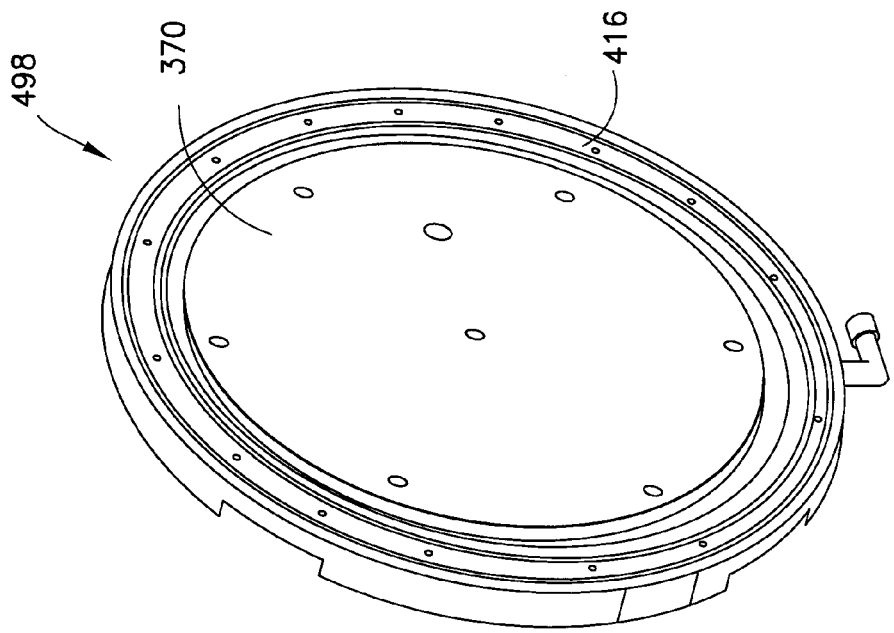
FIG. 20 shows an isometric view of a Bernoulli chuck assembly.
Figure 19:
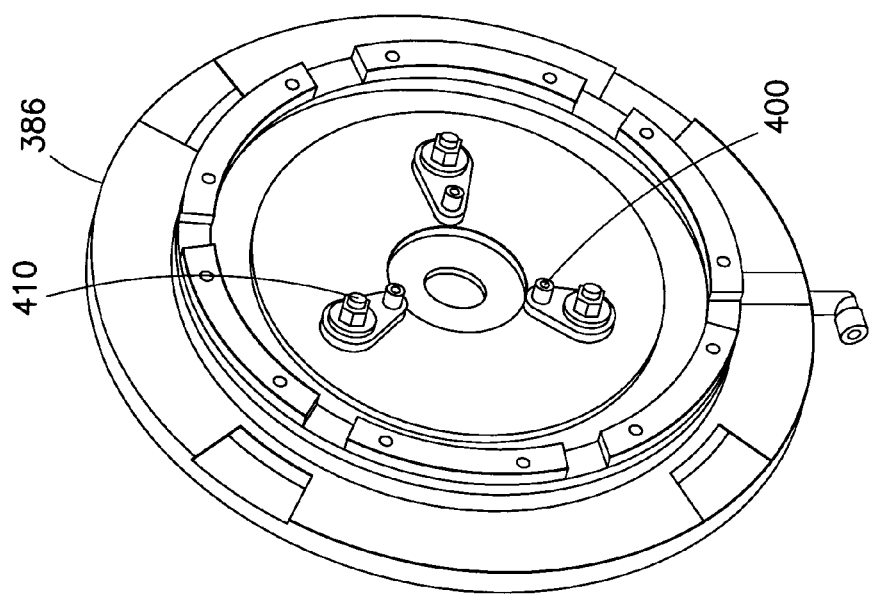
FIG. 19 shows an isometric view of a Bernoulli chuck assembly.

Referring now to FIG. 19, there is shown an isometric view of a representative Bernoulli chuck and ring assembly 498 with chuck assembly 370 and contact ring seal vacuum ring 386. Referring also to FIG. 20, there is shown an isometric view of a Bernoulli chuck and ring assembly 498. Referring also to FIG. 21, there is shown an exploded isometric view of a Bernoulli chuck and ring assembly 498. In the embodiment shown, chuck 370 is axially moveable with respect to contact ring seal vacuum ring 386. Shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly where the face of chuck assembly 370 remains substantially parallel with the suction and locating feature 404 of ring assembly 386 during motion regardless of the orientation or location of the origin of a de-stick between a substrate and a contact ring seal held by feature 404 and regardless of the propagation of the de-stick. In alternate embodiments, any suitable mechanism, such as combinations of slides, bushings or any suitable guide or otherwise may be provided to constrain chuck assembly 370 substantially parallel with ring assembly 386 during motion. Here, contact ring seal vacuum ring 386 is provided with a Viton® vacuum ring 404 with contact ring seal vacuum ports 416, Bernoulli plate 370 and contact ring seal vacuum supply 414. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the position shown in FIG. 9 which corresponds to a position where bladder 412 is deflated. Alternately, where bladder 412 is inflated, chuck 370 is axially moved to the location shown in FIG. 8. Bearing capture 500 may be provided to capture the inner race of a bearing as will be described with respect to FIG. 23 to allow the chuck assembly to rotate, for example, where the contact ring seal lock pins engage and disengage the keyholes of the holder and where lock stop 502 is provided to prevent overtravel. Flag 504 and photoelectric or other suitable sensor 506 may be provided to detect a position state of chuck 370 with respect to ring assembly 386.

Figure 22:
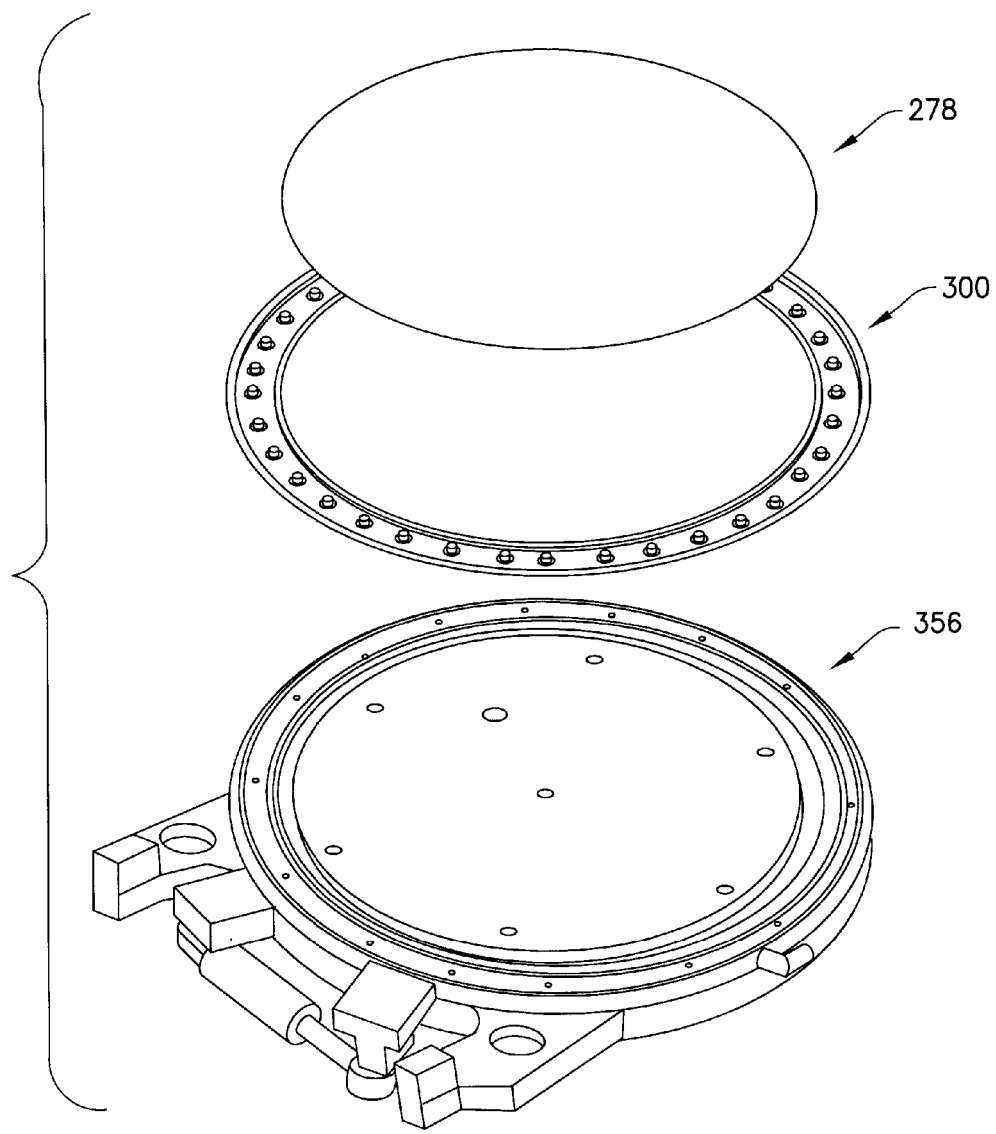
FIG. 22 shows an isometric view of a Bernoulli chuck door assembly.
Figure 23:
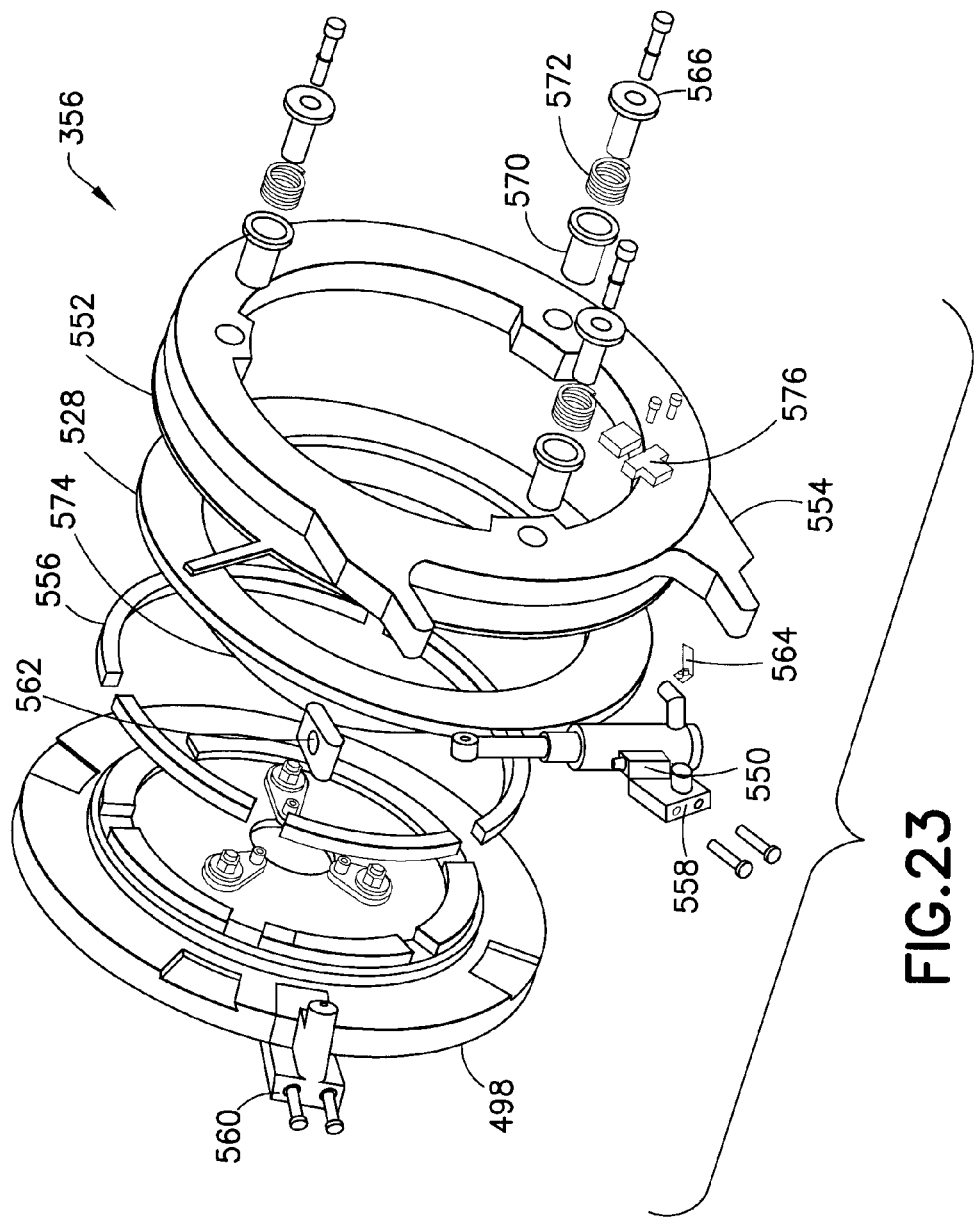
FIG. 23 shows an exploded isometric view of a Bernoulli chuck door assembly.

Referring now to FIG. 22, there is shown an isometric view of a representative Bernoulli chuck door assembly 356, contact ring seal 300 and substrate 278. Referring also to FIG. 23, there is shown an exploded isometric view of the Bernoulli chuck door assembly 356. In the embodiment shown, main door plate 554 may be grounded or coupled to swing axis 354 and engages for example clamps 358, 360 when loader 274 is performing a load or unload operation with respect to holder 270 (FIG. 7). The door assembly configuration illustrates for example purposes only, and in alternate embodiments the assembly and components may have any other desirable configuration. Translation plate 568 is coupled to main door plate 554 where door translation guides 566 are coupled to translation plate 568 and is axially moveable within flange bearings 570. Springs 572 bias translation plate 568 toward main door plate 554 as springs 572 are compressed between the shoulder on door translation guides 566 and the flange of flange bearings 570. Secondary bladder 552 is disposed between translation plate 568 and main door plate 554 where inflation separates translation plate 568 and main door plate 554 and where deflation biases translation plate 568 toward main door plate 554. Door translation flag 564 and photo electric sensor 576 are provided to detect the position state of translation plate 568 with respect to main door plate 554. Door translation guides 566 in combination with flange bearings 570 constrain the surface of translation plate 568 (and hence chuck assembly 370) to remain substantially parallel with the surface of main door plate 554 during axial extension and retraction of the translation plate 568 regardless of the orientation or location of the origin of a de-stick, for example from a substrate or contact ring seal or otherwise and regardless of the propagation of the de-stick. Chuck and ring assembly 498 is rotationally coupled to translation plate 568 by Bearing 574, for example, a 4 point Reali-Slim® 10.75" od×10" id bearing or otherwise where bearing capture plates 556 couple the outer race to translation plate 568 and where the inner race is coupled to Chuck and ring assembly 498 as previously described. Cylinder assembly 550 or any suitable actuator linear stepper or otherwise may have stops and or limit sensors and is coupled to Chuck and ring assembly 498 with moving cylinder mount 560 and is further coupled to main door plate 554 with fixed cylinder mount 558. Door lock block 562 may be provided, for example, to act as a stop or otherwise. In operation, the swing and tilt axes of loader 274 move the door assembly 356 where the door assembly includes bearing 574 for contact ring seal lock and unlock that is tightly integrated within the envelope of the door assembly 356 where secondary translation bladder 552 and guide assembly is provided for the final linear translation engagement of the contact ring seal studs into the spring plate. Here, guidance and constraint of the CRS axial engagement motion and chuck engagement motion minimize or eliminate play and maintain parallelism between the contact ring seal 300 and chuck 370 and the reference surfaces of the holder/wafer during actuation with their respective bladders.

Figure 24:
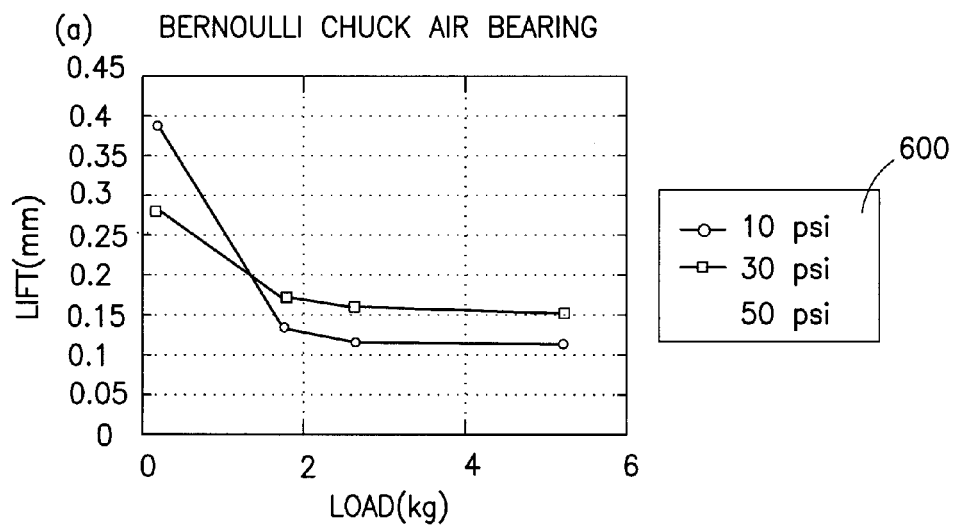
FIG. 24 is a graph showing several exemplary lift vs. force plots for different gas pressure of a Bernoulli chuck in accordance with an exemplary embodiment.

Referring now to FIG. 24, there is shown a graph 600 of lift vs. force for a Bernoulli chuck. As can be seen, if load increases then lift decreases. Further, if pressure increases then gap increases at higher loads whereas gap decreases at lower loads.

Figure 26:
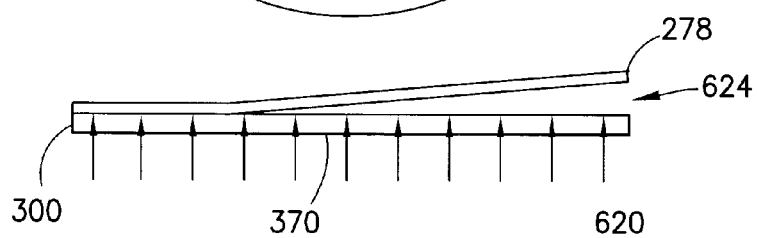
FIG. 26 shows a side view of a peel interface.

Referring now to FIG. 25, there is shown a top view of a peel interface. Referring also to FIG. 26, there is shown a side view of a peel interface. The graphical representation of a peel interface has contact ring seal and wafer 278 with the application of air bearing force 620. Peel angle 624 and peel interface width 626 are established with peel propagation 628 originating at a minimum sticking region 630 and propagating through peel positional angle 632 to a final sticking region 634 via a propagating peel interface location 636. In the embodiment shown, a model for separation of wafer from a contact ring seal may have three phases: Initial separation at a minimum sticking position 630; peel mode propagation via a propagating peel interface location 636; and Final sticking at position 634 of maximum required force. Peel strength is the average load per unit width of bondline required to separate progressively a flexible member from a rigid member or another flexible member. In the present embodiment, both the contact ring seal Viton® and the wafer are flexible due to their elasticity. Here, in the first phase, separation begins at a location of minimum sticking force 630. In the second "peel propagation" phase, the wafer peels from the contact ring seal. As the peel positional angle $\phi$ 632 increases, the peel interface width 626 increases as tan $\phi$. In a simple model of constant adhesive force, the air bearing force required to separate the bond-line also increases as tan $\phi$. The separation of wafer and contact ring seal will continue in a peel mode until it reaches an area of maximum sticking 634. If the adhesion is uniform then maximum sticking is opposite the initial location as shown in FIG. 25. Alternately, the area of maximum sticking may be in another position if the adhesion is non-uniform, for example, the non-uniform adhesion may be caused by non-uniform coating wear or a localized chemistry buildup or otherwise. For pressure sensitive adhesives, typical peel forces may be a few lbs. per inch. In the embodiment shown, the contact ring seal effective seal width may only be a few mils for most $\phi$ 632, but may increase, for example, to an inch or so near $\phi=\pi$. As such, chuck 370 provides, for example, several lbs. of force without touching the wafer in order to de-stick without contact.

Figure 27:
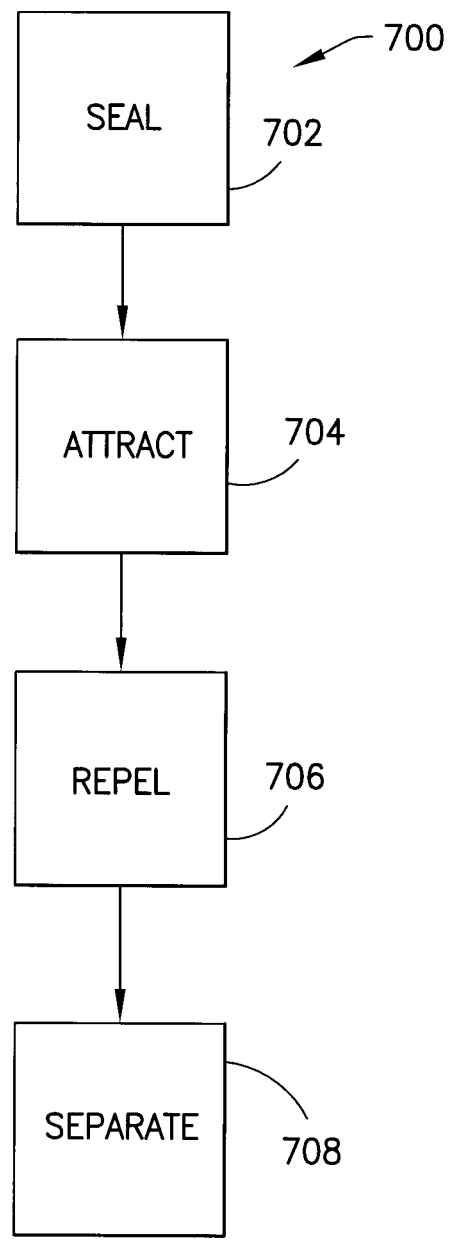
FIG. 27 shows a flow diagram.

Referring now to FIG. 27, there is shown flow diagram 700 graphically illustrating an exemplary method of separating a substrate from an adhering surface by providing a seal 702. Method 700 further provides attracting 704 a surface of the substrate to the seal with a Bernoulli chuck acting on the surface of the substrate and without contacting the substrate with the Bernoulli chuck. Method 700 further provides repelling 706 the surface of the substrate from the seal with the Bernoulli chuck acting on the surface of the substrate and without contacting the substrate with the Bernoulli chuck. In accordance with method 700 The surface of the substrate may be repelled 706 from the seal with the Bernoulli chuck acting on the surface of the substrate and without contacting the substrate with the Bernoulli chuck. In method 700, the Bernoulli chuck may be axially moveable relative to the seal with a predetermined motion profile. Further, in method 700 the Bernoulli chuck may have a Bernoulli hole pattern that increases lift at an outer edge of the Bernoulli chuck as compared to a center portion of the Bernoulli chuck. Further, in method 700 the Bernoulli chuck may be constrained to remain substantially parallel to a seal surface of the seal regardless of a de stick propagation location between the substrate and the seal while the substrate is separating from the seal. Further, in method 700, separating 708 may be moving the Bernoulli chuck from a first position to a second position relative to the seal by a force applied by a preloaded spring and damped between the Bernoulli chuck and the seal. Further, in method 700 the Bernoulli chuck may have an outer region having a higher gas flow as compared to an inner region of the Bernoulli chuck, where the outer region provides a stiffer interface between the substrate and the Bernoulli chuck as compared to the inner region. In alternate methods, more or less features in alternate sequence and with more or less structure may be provided.

In a first aspect of the disclosed embodiment a substrate chuck comprises a frame forming a support adapted to support an adhering surface thereon and a Bernoulli chuck surface coupled to the frame and adapted to support the substrate, the Bernoulli chuck surface being axially moveable relative to the support. The Bernoulli chuck surface has a first position adjacent the substrate with the substrate coupled to the adhering surface, and wherein the Bernoulli chuck surface is moveable from the first position to a second position separating the substrate from the adhering surface without contact between the substrate and the Bernoulli chuck surface.

In accordance with the first aspect of the disclosed embodiment wherein the Bernoulli chuck surface is constrained to remain substantially parallel to the adhering surface.

In accordance with the first aspect of the disclosed embodiment wherein the Bernoulli chuck surface has a Bernoulli hole pattern that is axisymmetric.

In accordance with the first aspect of the disclosed embodiment wherein the Bernoulli chuck surface has a Bernoulli hole pattern that increases lift at an outer edge of the Bernoulli chuck surface as compared to a center of the Bernoulli chuck surface.

In accordance with the first aspect of the disclosed embodiment wherein the Bernoulli chuck surface is axially moveable relative to the support with a predetermined motion profile.

In accordance with the first aspect of the disclosed embodiment wherein the substrate is attracted to the adhering surface and the Bernoulli chuck surface by suction of the Bernoulli gas flow when in the first position, and wherein the substrate floats on a cushion of gas on the Bernoulli chuck surface when in the second position.

In accordance with the first aspect of the disclosed embodiment wherein the Bernoulli chuck surface is constrained to remain substantially parallel to the adhering surface regardless of a de-stick propagation location between the substrate and the adhering surface.

In accordance with the first aspect of the disclosed embodiment wherein the Bernoulli chuck surface is moved from the first position to the second position by a force applied by a preloaded spring and damped between the Bernoulli chuck surface and the adhering surface.

In accordance with the first aspect of the disclosed embodiment wherein the Bernoulli chuck surface has outer annular region having a higher gas flow as compared to an inner annular region of the Bernoulli chuck surface, wherein the outer annular region provides a stiffer interface between the substrate and the Bernoulli chuck surface as compared to the inner annual region.

In accordance with a second aspect of the disclosed embodiment a mechanism is adapted to separate a substrate from a sealing surface. The mechanism comprises a support structure adapted to grip the sealing surface. A moveable chuck positioned within the support structure so that the support structure is a retaining support structure for the moveable chuck, the moveable central chuck having a Bernoulli effect portion. A controller configured for providing one or more predetermined combinations of air bearing pressure and partial vacuum caused by Bernoulli gas flow of the Bernoulli effect portion to generate a non-contact force on the substrate. The non-contact force overcomes adhesive forces between the sealing surface and the substrate, and wherein the non-contact force transports and positions the substrate with the moveable chuck.

In accordance with the second aspect of the disclosed embodiment wherein the moveable chuck is constrained to remain substantially parallel to the sealing surface.

In accordance with the second aspect of the disclosed embodiment wherein the Bernoulli effect portion has a Bernoulli hole pattern that is axisymmetric.

In accordance with the second aspect of the disclosed embodiment the Bernoulli effect portion has a Bernoulli hole pattern that increases lift at an outer edge of the Bernoulli effect portion as compared to a center region of the Bernoulli effect portion.

In accordance with the second aspect of the disclosed embodiment wherein the moveable chuck is axially moveable relative to the retaining support structure with a predetermined motion profile.

In accordance with the second aspect of the disclosed embodiment wherein the substrate is attracted to the sealing surface and the Bernoulli effect portion by suction of the Bernoulli effect portion when in a first position with the substrate contacting the sealing surface, and wherein the substrate floats on a cushion of gas on the Bernoulli effect portion when in a second position with the substrate separated from the sealing surface.

In accordance with the second aspect of the disclosed embodiment wherein the moveable chuck is constrained to remain substantially parallel to the sealing surface regardless of a de-stick propagation location between the substrate and the sealing surface while the substrate is separating from the sealing surface.

In accordance with the second aspect of the disclosed embodiment wherein the moveable chuck is moved from a first position with the substrate contacting the sealing surface to a second position with the substrate separated from the sealing surface by a force applied by a preloaded spring and damped between the moveable central chuck and the sealing surface.

In accordance with the second aspect of the disclosed embodiment wherein the Bernoulli effect portion has outer annular region having a higher gas flow as compared to an inner annular region of the Bernoulli effect portion, wherein the outer annular region provides a stiffer interface between the substrate and the Bernoulli effect portion as compared to the inner annual region.

In accordance with the second aspect of the disclosed embodiment wherein the support structure is movable so that the substrate held by the Bernoulli effect portion is movable between different positions wherein the substrate plane when at the different positions defines an angle therebetween.

In accordance with a third aspect of the disclosed embodiment a substrate chuck comprises a frame with a peripheral edge seal adapted to seal a peripheral edge of the substrate. A Bernoulli chuck surface connected to the frame and adapted to support the substrate, the Bernoulli chuck surface and the peripheral edge seal being movable configured for relative movement relative to each other from a first position with the substrate contacting the peripheral edge seal to a second position with the substrate not contacting the peripheral edge seal. The substrate is adhered to the peripheral edge seal when contacting the peripheral edge seal, and wherein the Bernoulli chuck surface effects separation of the substrate from the peripheral edge seal when transitioning from the first position to the second position, and wherein the Bernoulli chuck surface effects the separation of the substrate from the peripheral edge seal without the Bernoulli chuck surface contacting the substrate.

In accordance with the third aspect of the disclosed embodiment wherein the substrate is attracted to the peripheral edge seal and the Bernoulli chuck surface by suction of the Bernoulli chuck surface when in the first position, and wherein the substrate floats on a cushion of gas on the Bernoulli chuck surface when in the second position.

In accordance with the third aspect of the disclosed embodiment wherein the Bernoulli chuck surface is axially moveable relative to the peripheral edge seal with a predetermined motion profile.

In accordance with the third aspect of the disclosed embodiment wherein the Bernoulli chuck surface has a Bernoulli hole pattern that increases lift at an outer edge of the Bernoulli chuck surface as compared to a center portion of the Bernoulli chuck surface.

In accordance with the third aspect of the disclosed embodiment wherein the Bernoulli chuck surface is constrained to remain substantially parallel to a seal surface of the peripheral edge seal regardless of a de-stick propagation location between the substrate and the peripheral edge seal while the substrate is separating from the peripheral edge seal.

In accordance with the third aspect of the disclosed embodiment wherein the Bernoulli chuck surface has outer annular region having a higher gas flow as compared to an inner annular region of the Bernoulli chuck surface, wherein the outer annular region provides a stiffer interface between the substrate and the Bernoulli chuck surface as compared to the inner annual region.

In accordance with a fourth aspect of the disclosed embodiment a method of separating a substrate from an adhering surface comprises providing a seal; attracting a surface of the substrate to the seal with a Bernoulli chuck acting on the surface of the substrate and without contacting the substrate with the Bernoulli chuck; repelling the surface of the substrate from the seal with the Bernoulli chuck acting on the surface of the substrate and without contacting the substrate with the Bernoulli chuck; and separating the surface of the substrate from the seal with the Bernoulli chuck acting on the surface of the substrate and without contacting the substrate with the Bernoulli chuck.

It should be understood that the foregoing description is only illustrative of the invention. Various alternatives and modifications can be devised by those skilled in the art without departing from the invention. Accordingly, the present invention is intended to embrace all such alternatives, modifications and variances.

What is claimed is:

1. A substrate chuck, the substrate chuck comprising:
 a frame forming a support, wherein said support supports an adhering surface thereon; and
 a Bernoulli chuck surface coupled to the frame and adapted to support the substrate, the Bernoulli chuck surface being axially moveable relative to the support and relative to the adhering surface, and wherein the adhering surface extends about a periphery of at least a portion of the Bernoulli chuck surface;
 wherein, the Bernoulli chuck surface has a first position adjacent and facing toward the substrate with the substrate coupled to the adhering surface, and wherein the Bernoulli chuck surface is axially moveable relative to the adhering surface from the first position to a second position separating the substrate from the adhering surface without contact between the substrate and the Bernoulli chuck surface.

2. The substrate chuck of claim 1 wherein the Bernoulli chuck surface is constrained to remain substantially parallel to the adhering surface.

3. The substrate chuck of claim 1 wherein the Bernoulli chuck surface has a Bernoulli hole pattern that is axisymmetric.

4. The substrate chuck of claim 1 wherein the Bernoulli chuck surface has a Bernoulli hole pattern that increases lift at an outer edge of the Bernoulli chuck surface as compared to a center of the Bernoulli chuck surface.

5. The substrate chuck of claim 1 wherein the Bernoulli chuck surface is axially moveable relative to the support with a predetermined motion profile.

6. The substrate chuck of claim 1, wherein the substrate is attracted to the adhering surface and the Bernoulli chuck surface by suction of the Bernoulli gas flow when in the first position, and wherein the substrate floats on a cushion of gas on the Bernoulli chuck surface when in the second position.

7. The substrate chuck of claim 1, wherein the Bernoulli chuck surface is constrained to remain substantially parallel to the adhering surface regardless of a de-stick propagation location between the substrate and the adhering surface.

8. The substrate chuck of claim 1, wherein the Bernoulli chuck surface is moved from the first position to the second position by a force applied by a preloaded spring and damped between the Bernoulli chuck surface and the adhering surface.

9. The substrate chuck of claim 1, wherein the Bernoulli chuck surface has an outer annular region having a higher gas flow as compared to an inner annular region of the Bernoulli chuck surface, wherein the outer annular region provides a stiffer interface between the substrate and the Bernoulli chuck surface as compared to the inner annual annular region.

10. A substrate chuck according to claim 1, wherein the Bernoulli chuck surface is substantially parallel to a surface of the substrate, and wherein the Bernoulli chuck surface moves axially relative to the adhering surface in a direction substantially perpendicular to the surface of the substrate and perpendicular to the Bernoulli chuck surface.

11. A mechanism adapted to separate a substrate from a sealing surface, the mechanism comprising:
 a support structure adapted to grip the sealing surface;
 a moveable chuck positioned within the support structure so that the support structure is a retaining support structure for the moveable chuck, the moveable chuck having a Bernoulli effect portion, and wherein the sealing surface extends about at least a portion of a periphery of the movable chuck and the movable chuck is movable relative to the sealing surface; and
 a controller configured for providing a non-contact force upon movement of the movable chuck relative to the sealing surface, the non-contact force comprising one or more predetermined combinations of air bearing pressure and partial vacuum caused by Bernoulli gas flow of the Bernoulli effect portion to generate a non-contact force on the substrate;

wherein the non-contact force overcomes adhesive forces between the sealing surface and the substrate, and wherein the non-contact force transports and positions the substrate with the moveable chuck.

12. The mechanism of claim 11 wherein the moveable chuck is constrained to remain substantially parallel to the sealing surface.

13. The mechanism of claim 11 wherein the Bernoulli effect portion has a Bernoulli hole pattern that is axisymmetric.

14. The mechanism of claim 11 wherein the Bernoulli effect portion has a Bernoulli hole pattern that increases lift at an outer edge of the Bernoulli effect portion as compared to a center region of the Bernoulli effect portion.

15. The mechanism of claim 11 wherein the moveable chuck is axially moveable relative to the retaining support structure with a predetermined motion profile.

16. The mechanism of claim 11, wherein the substrate is attracted to the sealing surface and the Bernoulli effect portion by suction of the Bernoulli effect portion when the Bernoulli effect portion is in a first position with the substrate contacting the sealing surface, and wherein the substrate floats on a cushion of gas on the Bernoulli effect portion when the Bernoulli effect portion is in a second position with the substrate separated from the sealing surface, and wherein the Bernoulli effect portion moves axially from the first position to the second position with axial movement relative to the support structure and in a direction substantially perpendicular to a surface of the substrate.

17. The mechanism of claim 11, wherein the moveable chuck is constrained to remain substantially parallel to the sealing surface regardless of a de-stick propagation location between the substrate and the sealing surface while the substrate is separating from the sealing surface.

18. The mechanism of claim 11, wherein the moveable chuck is moved from a first position with the substrate contacting the sealing surface to a second position with the substrate separated from the sealing surface by a force applied by a preloaded spring and damped between the moveable chuck and the sealing surface.

19. The mechanism of claim 11, wherein the Bernoulli effect portion has an outer annular region having a higher gas flow as compared to an inner annular region of the Bernoulli effect portion, wherein the outer annular region provides a stiffer interface between the substrate and the Bernoulli effect portion as compared to the inner annular region.

20. The mechanism of claim 11 wherein the support structure is movable so that the substrate held by the Bernoulli effect portion is movable between different positions wherein the substrate plane when at the different positions defines an angle therebetween.

21. The mechanism of claim 11, wherein a surface of the Bernoulli effect portion is substantially parallel to the substrate when the substrate is adhered to the sealing surface, and wherein the surface of the Bernoulli effect portion is movable relative to the sealing surface in a direction substantially perpendicular to the substrate surface to separate the substrate from the sealing surface without contacting the substrate.

22. A substrate chuck comprising:
a frame with a peripheral edge seal adapted to seal a peripheral edge of the substrate; and
a Bernoulli chuck surface connected to the frame and adapted to support the substrate, the Bernoulli chuck surface and the peripheral edge seal being configured for relative movement relative to each other from a first position with the substrate contacting the peripheral edge seal to a second position with the substrate not contacting the peripheral edge seal;
wherein, the substrate is adhered to the peripheral edge seal when contacting the peripheral edge seal, and wherein the Bernoulli chuck surface effects separation of the substrate from the peripheral edge seal with movement from the first position to the second position, and wherein the Bernoulli chuck surface effects the separation of the substrate from the peripheral edge seal without the Bernoulli chuck surface contacting the substrate; and
wherein the substrate is attracted to the peripheral edge seal and the Bernoulli chuck surface by suction of the Bernoulli chuck surface when in the first position, and wherein the substrate floats on a cushion of gas on the Bernoulli chuck surface when in the second position.

23. The substrate chuck of claim 22, wherein the Bernoulli chuck surface has a Bernoulli hole pattern that increases lift at an outer edge of the Bernoulli chuck surface as compared to a center portion of the Bernoulli chuck surface.

24. The substrate chuck of claim 22, wherein the Bernoulli chuck surface is constrained to remain substantially parallel to a seal surface of the peripheral edge seal regardless of a de-stick propagation location between the substrate and the peripheral edge seal while the substrate is separating from the peripheral edge seal.

25. The substrate chuck of claim 22, wherein the Bernoulli chuck surface is moved from the first position to the second position by a force applied by a preloaded spring and damped between the Bernoulli chuck surface and the peripheral edge seal.

26. The substrate chuck of claim 22, wherein the Bernoulli chuck surface has an outer annular region having a higher gas flow as compared to an inner annular region of the Bernoulli chuck surface, wherein the outer annular region provides a stiffer interface between the substrate and the Bernoulli chuck surface as compared to the inner annular region.

27. A substrate chuck according to claim 22, wherein the peripheral edge seal extends about a periphery of the Bernoulli chuck surface, and wherein the Bernoulli chuck surface moves axially relative to the peripheral edge seal from the first position to the second position.

28. A substrate chuck according to claim 27, wherein the axial movement of the Bernoulli chuck surface is in a direction perpendicular to the substrate.

29. A method of separating a substrate from an adhering surface comprising:
providing a seal;
attracting a surface of the substrate to the seal with a Bernoulli chuck acting on the surface of the substrate and without contacting the substrate with the Bernoulli chuck;
repelling the surface of the substrate from the seal while moving the Bernoulli chuck relative to the seal with the Bernoulli chuck acting on the surface of the substrate and without contacting the substrate with the Bernoulli chuck; and
separating the surface of the substrate from the seal with movement of the Bernoulli chuck and with the Bernoulli chuck acting on the surface of the substrate and without contacting the substrate with the Bernoulli chuck.

30. A method according to claim 29, wherein the Bernoulli chuck moves to separate the substrate from the seal in an axial direction, wherein the axial direction is perpendicular to a surface of the substrate.

* * * * *

UNITED STATES PATENT AND TRADEMARK OFFICE
CERTIFICATE OF CORRECTION

| | | |
|---|---|---|
| PATENT NO. | : 8,613,474 B2 | Page 1 of 1 |
| APPLICATION NO. | : 13/279405 | |
| DATED | : December 24, 2013 | |
| INVENTOR(S) | : Daniel Goodman et al. | |

It is certified that error appears in the above-identified patent and that said Letters Patent is hereby corrected as shown below:

Claims

Column 16, line 44, Claim 9, delete "annual".

Signed and Sealed this
Seventeenth Day of November, 2015

Michelle K. Lee
*Director of the United States Patent and Trademark Office*